US009106126B2

(12) United States Patent
Bae et al.

(10) Patent No.: US 9,106,126 B2
(45) Date of Patent: Aug. 11, 2015

(54) VOLTAGE GENERATING CIRCUIT AND DISPLAY APPARATUS HAVING THE SAME

(75) Inventors: Yu-Han Bae, Seoul (KR); Young-Su Kim, Daegu (KR); Jae-Hoon Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 1159 days.

(21) Appl. No.: 12/885,785

(22) Filed: Sep. 20, 2010

(65) Prior Publication Data

US 2011/0273416 A1 Nov. 10, 2011

(30) Foreign Application Priority Data

May 6, 2010 (KR) ........................ 10-2010-0042557

(51) Int. Cl.
*H02M 3/07* (2006.01)
*G09G 3/36* (2006.01)
*G11C 5/14* (2006.01)
*G11C 19/28* (2006.01)

(52) U.S. Cl.
CPC ............... *H02M 3/07* (2013.01); *G09G 3/3648* (2013.01); *G09G 3/3677* (2013.01); *G11C 5/145* (2013.01); *G11C 19/28* (2013.01); *G09G 2230/00* (2013.01); *G09G 2300/0408* (2013.01); *G09G 2310/0286* (2013.01); *H02M 2003/072* (2013.01)

(58) Field of Classification Search
CPC .......... G11C 5/14; G11C 5/145; G11C 5/147; G11C 11/39; H02M 3/07; H02M 2003/072; H02M 3/155; H02M 2001/009; H02M 2003/073; H02M 2003/071; H02M 2003/075; H02M 2003/077; H05B 33/0815; G09G 3/006; G09G 3/3648; G09G 3/3674; G09G 3/3677; G09G 3/3611; G09G 2310/0264; G09G 2310/0267; G09G 2310/0286; G09G 2310/0289; G09G 2330/02; G09G 2300/0408
USPC ........... 345/208–215, 82, 89, 92, 87, 99–100; 327/536–537, 115, 117, 512, 156; 714/726; 326/21; 323/282; 341/143, 341/155; 363/127; 315/247; 340/10.1; 235/492; 307/149; 361/58

See application file for complete search history.

(56) References Cited

U.S. PATENT DOCUMENTS

| | | | | | |
|---|---|---|---|---|---|
| 5,250,937 | A * | 10/1993 | Kikuo et al. | ..................... | 345/89 |
| 5,999,475 | A * | 12/1999 | Futatsuya et al. | ............. | 365/226 |
| 6,184,741 | B1 * | 2/2001 | Ghilardelli et al. | ........... | 327/536 |
| 7,075,356 | B2 * | 7/2006 | Mayama et al. | ............... | 327/536 |
| 7,944,427 | B2 * | 5/2011 | Choi | ............................. | 345/100 |
| 7,969,231 | B2 * | 6/2011 | Yamahira | ...................... | 327/536 |
| 8,127,998 | B2 * | 3/2012 | Kozuma et al. | ............... | 235/492 |

(Continued)

FOREIGN PATENT DOCUMENTS

JP 09-023639 A 1/1997
JP 2000-047624 A 2/2000

(Continued)

*Primary Examiner* — Dwayne Bost
*Assistant Examiner* — Darlene M Ritchie
(74) *Attorney, Agent, or Firm* — Cantor Colburn LLP

(57) ABSTRACT

A voltage generating circuit includes a first charge pumping part and a second charge pumping part. The first charge pumping part pumps a switching voltage, in response to a reference voltage, to output a first voltage. The second charge pumping part pumps the switching voltage, in response to the first voltage, to output a second voltage that is lower than the first voltage that is varied in accordance with time.

17 Claims, 13 Drawing Sheets

(56) References Cited

U.S. PATENT DOCUMENTS

| | | | |
|---|---|---|---|
| 8,461,910 B2* | 6/2013 | Nadimpalli | 327/536 |
| 2003/0189483 A1* | 10/2003 | Saitoh et al. | 340/10.1 |
| 2004/0145396 A1* | 7/2004 | Yee et al. | 327/156 |
| 2005/0052170 A1* | 3/2005 | Kim et al. | 323/282 |
| 2007/0018933 A1* | 1/2007 | Lee | 345/98 |
| 2007/0132674 A1* | 6/2007 | Tsuge | 345/77 |
| 2007/0192659 A1* | 8/2007 | Kang et al. | 714/726 |
| 2007/0296681 A1* | 12/2007 | Kim et al. | 345/100 |
| 2008/0001904 A1* | 1/2008 | Kim et al. | 345/100 |
| 2008/0036725 A1* | 2/2008 | Lee et al. | 345/100 |
| 2008/0048712 A1* | 2/2008 | Ahn et al. | 326/21 |
| 2008/0054987 A1* | 3/2008 | Choi et al. | 327/512 |
| 2008/0062100 A1* | 3/2008 | Hong et al. | 345/87 |
| 2008/0079701 A1* | 4/2008 | Shin et al. | 345/204 |
| 2008/0088550 A1* | 4/2008 | Kim et al. | 345/82 |
| 2008/0093934 A1* | 4/2008 | Kato | 307/149 |
| 2008/0093935 A1* | 4/2008 | Saito et al. | 307/149 |
| 2008/0284497 A1* | 11/2008 | Kim et al. | 327/536 |
| 2008/0309597 A1* | 12/2008 | Nam et al. | 345/87 |
| 2009/0058509 A1* | 3/2009 | Kimura | 327/537 |
| 2009/0066684 A1* | 3/2009 | Lee | 345/211 |
| 2009/0296298 A1* | 12/2009 | Divan | 361/58 |
| 2010/0053054 A1* | 3/2010 | Jeong et al. | 345/92 |
| 2011/0193853 A1* | 8/2011 | Sakamoto et al. | 345/213 |

FOREIGN PATENT DOCUMENTS

| | | |
|---|---|---|
| JP | 2008310317 A | 12/2008 |
| KR | 1019990010291 A | 2/1999 |
| KR | 100495805 B1 | 6/2005 |
| KR | 100516051 B1 | 9/2005 |
| KR | 1020070059457 A | 6/2007 |
| KR | 1020070082145 A | 8/2007 |
| KR | 1020080111233 A | 12/2008 |

* cited by examiner

VOLTAGE GENERATING CIRCUIT AND DISPLAY APPARATUS HAVING THE SAME

This application claims priority to Korean Patent Application No. 2010-42557, filed on May 6, 2010, and all the benefits accruing therefrom under 35 U.S.C. §119, the contents of which are herein incorporated by reference in their entirety.

BACKGROUND OF THE INVENTION

1. Field of the Invention

Exemplary embodiments of the invention relate to a voltage generating circuit and a display apparatus having the voltage generating circuit. More particularly, exemplary embodiments of the invention relate to a voltage generating circuit for enhancing a driving reliability of a display apparatus and a display apparatus having the voltage generating circuit.

2. Description of the Related Art

In order to reduce manufacturing cost of a panel module for a display apparatus and decrease a total size thereof, a technology in which a gate drive circuit is simultaneously formed at a peripheral area of a panel when a switching element positioned at a display area of the panel is formed, has been adapted thereto.

Since the gate drive circuit generates gate signals by selecting a clock signal having a continuously varying phase, noise is generated due to the clock signal during a non-driving interval. Thus, various circuit structures for removing the noise generated during the non-driving interval have been developed.

However, when a temperature of the gate drive circuit is increased due to a long driving time, a high temperature noise is generated to the gate signal. Moreover, initial driving defects may be generated due to a leakage current, which is generated when a bootstrap is not normally completed, of transistors applying a low voltage to an output transistor of the gate drive circuit. The noise of the gate signal and the initial driving defects may decrease display quality.

BRIEF SUMMARY OF THE INVENTION

Exemplary embodiments of the invention provide a voltage generating circuit having enhanced driving reliability.

Exemplary embodiments of the invention provide a display apparatus having the above-mentioned voltage generating circuit.

In an exemplary embodiment of the invention, a voltage generating circuit includes a first charge pumping part and a second charge pumping part. The first charge pumping part pumps a switching voltage, in response to a reference voltage, to output a first voltage. The second charge pumping part pumps the switching voltage, in response to the first voltage, to output a second voltage that is lower than the first voltage that is varied in accordance with time.

In an exemplary embodiment, the second charge pumping part may include a first resistor, a first diode, a second diode, a first capacitor and a second capacitor. The first resistor is directly connected to the first charge pumping part. The first diode has a cathode connected to the first resistor in series. The second diode has a cathode connected to an anode of the first diode, and an anode connected to an output terminal of the second charge pumping part outputting the second voltage. The first capacitor has a first terminal connected between the first and second diodes, and a second terminal connected to an input terminal of the second charge pumping part receiving the switching voltage. The second capacitor has a first terminal connected to the output terminal of the second charge pumping part, and a second terminal connected to a reference terminal receiving the reference voltage.

In an exemplary embodiment, the second charge pumping part may further include a third capacitor connected between a cathode of the first diode and the reference terminal.

In an exemplary embodiment, the second charge pumping part may further include a second resistor connected to the first resistor in parallel and configured to have a resistance value that is decreased as a temperature is increased.

In an exemplary embodiment, the second charge pumping part may include a first diode, a second diode, a first resistor, a first capacitor and a second capacitor. The first diode has a cathode connected directly to the first charge pumping part. The second diode has a cathode connected to an anode of the first diode. The first resistor has a first terminal connected to an anode of the second diode. The first capacitor has a first terminal connected between the first and second diodes, and a second terminal connected to an input terminal of the second charge pumping part receiving the switching voltage. The second capacitor has a first terminal connected to the first resistor, and a second terminal connected to a reference terminal receiving the reference voltage. A first directional path is formed between a cathode of the first diode and a second terminal of the first resistor.

In an exemplary embodiment, the second charge pumping part may further include a third capacitor connected to the second terminal of the first resistor and the reference terminal.

In an exemplary embodiment, the second charge pumping part may further include an output terminal outputting a third voltage, in which the switching voltage is pumped in response to the first voltage.

In an exemplary embodiment, the second charge pumping part may further include a second resistor connected to the first resistor in parallel, and the second resistor has a resistance value that is decreased as a temperature is increased.

In another exemplary embodiment of the invention, a display apparatus includes a display panel, a source drive circuit, a voltage generating circuit and a gate drive circuit. The display panel includes a display area on which gate wiring, and source wiring crossing the gate wirings are disposed to display images, and a peripheral area surrounding the display area. The source drive circuit outputs a plurality of data signals to the source wiring. The voltage generating circuit includes a first charge pumping part and a second charge pumping part. The first charge pumping part pumps a switching voltage, in response to a reference voltage, to output a first voltage. The second charge pumping part pumps the switching voltage, in response to the first voltage, to output a second voltage that is lower than the first voltage that is varied in accordance with time. The gate drive circuit is integrated on the peripheral area to generate a gate signal. The gate drive circuit provides the gate wiring with a gate signal of a high level at a first interval, and provides the gate wiring with a gate signal of a low level based on the first and second voltages at a second interval.

In an exemplary embodiment, the second charge pumping part may include a first resistor, a first diode, a second diode, a first capacitor and a second capacitor. The first resistor is connected directly to the first charge pumping part. The first diode has a cathode connected to the first resistor in series. The second diode has a cathode connected to an anode of the first diode, and an anode connected to an output terminal of the second charge pumping part outputting the second voltage. The first capacitor has a first terminal connected between the first and second diodes, and a second terminal connected to an input terminal of the second charge pumping part receiving the switching voltage. The second capacitor has a first terminal connected to the output terminal of the second charge pumping part, and a second terminal connected to a reference terminal receiving the reference voltage.

In an exemplary embodiment, the second charge pumping part may further include a second resistor connected to the first resistor in parallel, and the second resistor has a resistance value that is decreased as a temperature is increased.

In an exemplary embodiment, the second charge pumping part may include a first diode, a second diode, a first resistor, a first capacitor and a second capacitor. The first diode has a cathode connected directly to the first charge pumping part. The second diode has a cathode connected to an anode of the first diode. The first resistor has a first terminal connected to an anode of the second diode. The first capacitor has a first terminal connected between the first and second diodes, and a second terminal connected to an input terminal of the second charge pumping part receiving the switching voltage. The second capacitor has a first terminal connected to the first resistor, and a second terminal connected to a reference terminal receiving the reference voltage. A first directional path is formed between a cathode of the first diode and a second terminal of the first resistor.

In an exemplary embodiment, the second charge pumping part may further include an output terminal outputting a third voltage, in which the switching voltage is pumped in response to the first voltage.

In an exemplary embodiment, the third voltage is a clock signal of a low level.

In an exemplary embodiment, the second charge pumping part may further include a second resistor connected to the first resistor in parallel, and the second resistor has a resistance value that is decreased as a temperature is increased.

In an example embodiment, the gate drive circuit may include a plurality of stages. Each of the stages may include a pull-up part, a pull-down part, a first maintaining part, and a second maintaining part. The pull-up part outputs a high voltage of a clock signal as a high voltage of a gate signal in response to a high voltage of a first node. The pull-down part pulls down the high voltage of the gate signal to the first voltage, in response to a high voltage of a carry signal of one of the stages corresponding to a following stage. The first maintaining part maintains the voltage of the gate signal to the first voltage, in response to the clock signal. The second maintaining part maintains a voltage of the first node to the second voltage, in response to the clock signal.

In an exemplary embodiment, the each stage may further include a carry part and a discharging part. The carry part outputs the clock signal as a carry signal, in response to the voltage of the first node. The discharging part discharges the voltage of the first node to the second voltage, in response to a carry signal of the one of the stages corresponding to the following stage.

In an exemplary embodiment, the stage may further include a third maintaining part, a fourth maintaining part and a fifth maintaining part. The third maintaining part maintains the voltage of the first node to the second voltage, in response to a carry signal of one of the stages corresponding to a previous stage. The fourth maintaining part maintains the voltage of the first node to the second voltage, in response to the carry signal of the one of the stages corresponding to the following stage. The fifth maintaining part maintains an output voltage of the carry part to the second voltage, in response to the carry signal of the one of the stages corresponding to the following stage.

In an exemplary embodiment, the each stage may further include a switching part discharging a voltage of a second node to the first voltage during the first interval in which a high voltage of the carry signal is outputted, and applying a signal synchronized with the clock signal to the second node during the remaining interval except the first interval.

In an exemplary embodiment, the each stage may further include a buffer part and a charging part. The buffer part applies a carry signal of one of the stages corresponding to a previous stage to the first node, in response to a carry signal of one of the stages corresponding to the previous stage. The charging part is connected between the first node and an output part of the pull-up part.

According to exemplary embodiments, a voltage generating circuit and a display apparatus including the voltage generating circuit, since a difference between a first voltage and a second voltage that are applied to the gate drive circuit is small after the gate drive circuit is initially driven, power consumption of the gate drive circuit may be reduced and initial driving defects of the gate drive circuit may be reduced or effectively prevented. Moreover, the interval voltage between the first voltage and the second voltage that are applied to the gate drive circuit is increased as time elapses, so that a high temperature margin may be secured. Thus, a driving reliability of the display apparatus may be enhanced.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
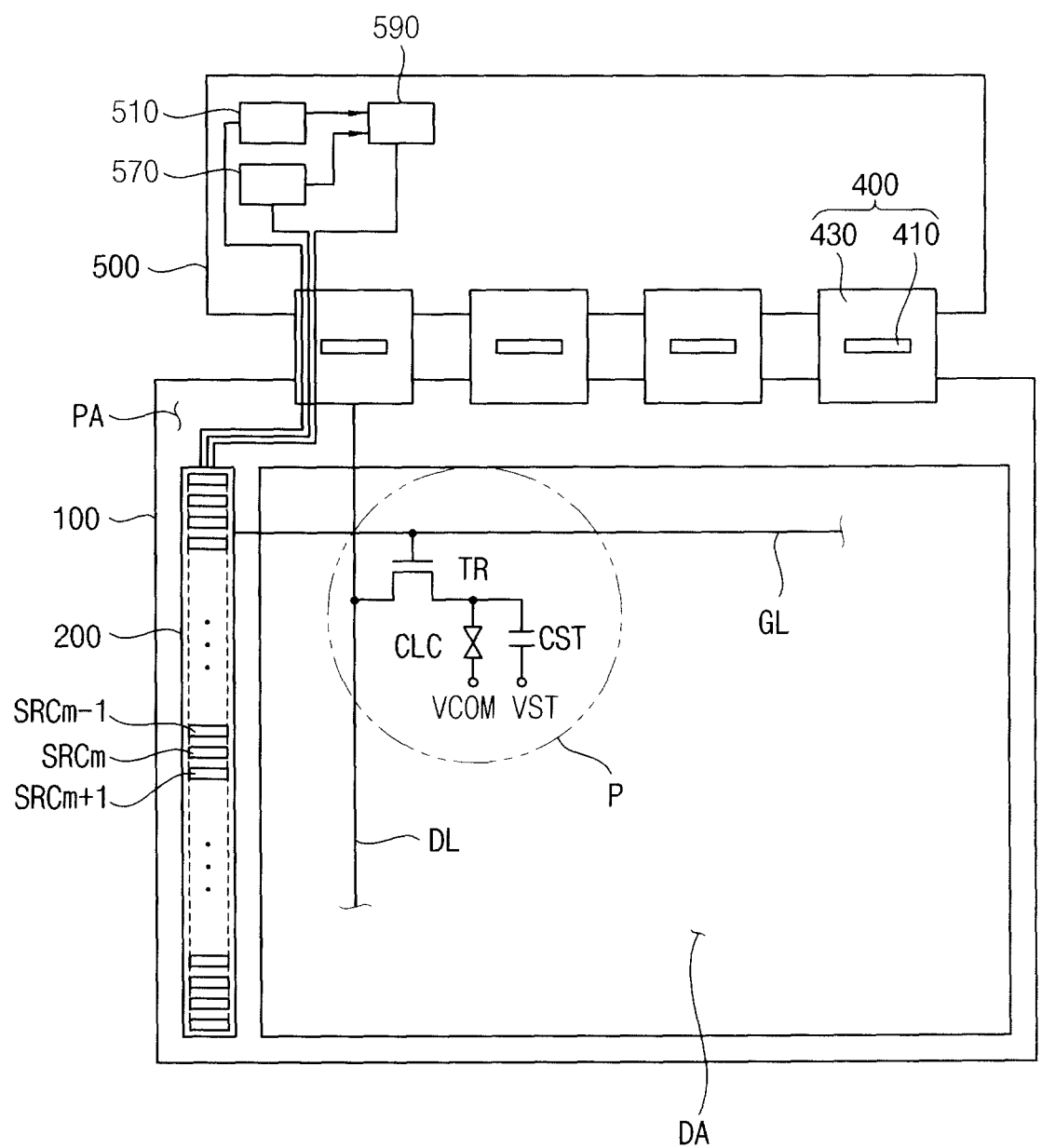
FIG. 1 is an exemplary embodiment of a plan view schematically showing a display apparatus, according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a plan view schematically showing an exemplary embodiment of a display apparatus, according to the invention.

Referring to FIG. 1, the display apparatus includes a display panel 100, a gate drive circuit 200, a source drive circuit 400 and a printed circuit board ("PCB") 500.

The display panel 100 includes a display area DA and a peripheral area PA surrounding and excluding the display area DA. A plurality of a gate wiring GL, a plurality of a source wiring DL and a plurality of a pixel part P are disposed within the display area DA. The gate wirings GL and the source wirings DL are crossed with each other, in a plan view of the display panel 100. Each of the pixel parts P includes a switching element TR electrically connected to a gate wiring GL and a source wiring DL, a liquid crystal capacitor CLC electrically connected to the switching element TR, and a storage capacitor CST electrically connected to the liquid crystal capacitor CLC in parallel.

The gate drive circuit 200 includes a shift register which sequentially outputs gate signals of a high level to the gate wirings GL. The shift register includes a plurality of stages SRCm−1, SRCm and SRCm+1, wherein 'm' is a natural number. The gate drive circuit 200 is integrated (e.g., directly) on the peripheral area PA adjacent to a first terminal portion of the gate wirings GL.

The source drive circuit 400 includes a source drive chip 410 and a flexible circuit substrate 430. The source drive chip 410 is mounted on the flexible circuit substrate 430 to provide the source wirings DL with data signals. The flexible circuit substrate 430 is physically and/or electrically contacted with the PCB 500 and the display panel 100. In the illustrated exemplary embodiment, the source drive chip 410 is mounted on the flexible circuit substrate 430. Alternatively, the source drive chip 410 may be directly mounted on the display panel 100. Further alternatively, the source drive chip 410 may be directly integrated on the peripheral area PA of the display panel 100.

The PCB 500 may include a voltage generating circuit 510, a high voltage generating circuit 570 and a clock signal generating circuit 590.

The voltage generating circuit 510 generates a first voltage and a second voltage. In this case, the second voltage is lower than the first voltage. The voltage generating circuit 510 includes a first charge pumping part and a second charge pumping part. The first charge pumping part pumps a switching voltage based on a reference voltage to output the first voltage. Here, the first voltage is generated regardless of the second voltage. The second charge pumping part may include a first resistor connected to a first terminal thereof to pump the switching voltage based on the first voltage, and outputs a second voltage varied in accordance with time by the first resistor.

The high voltage generating circuit 570 generates a high voltage.

The first voltage, the second voltage and the high voltage that are generated by the voltage generating circuit 510 and the high voltage generating circuit 570 may be selectively provided to the gate drive circuit 200 and the clock signal generating circuit 590.

In one exemplary embodiment, for example, the clock signal generating circuit 590 receives the second voltage and the high voltage respectively from the voltage generating circuit 510 and the high voltage generating circuit 570 to generate a clock signal. The generated clock signal is provided to the gate drive circuit 200.

The gate drive circuit 200 receives the first voltage, the second voltage and the high voltage generated from the voltage generating circuit 510 and the high voltage generating circuit 570, and receives the clock signal from the clock signal generating circuit 590.

Figure 2:
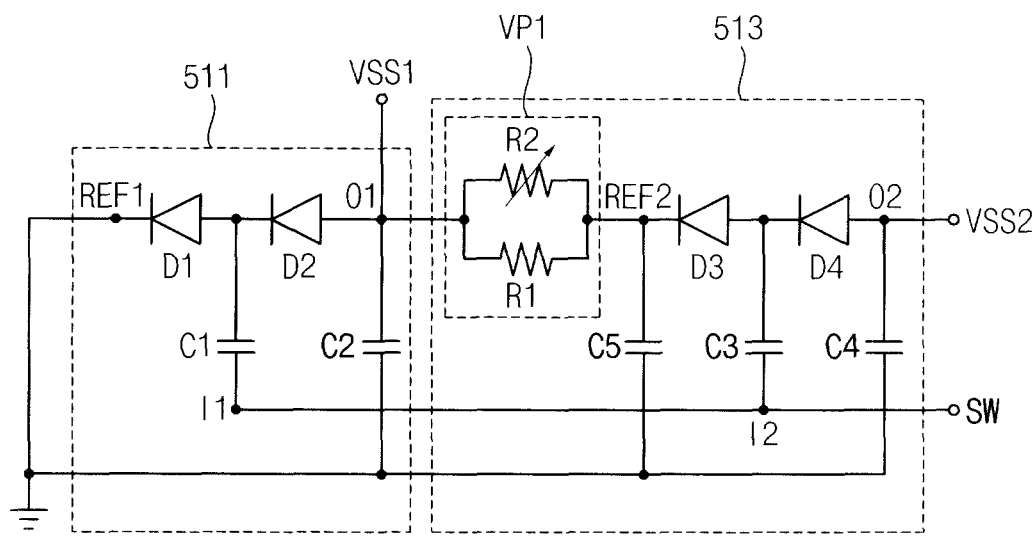
FIG. 2 is a circuit diagram showing an exemplary embodiment of the voltage generating circuit of FIG. 1.

FIG. 2 is a circuit diagram showing an exemplary embodiment of the voltage generating circuit 510 of FIG. 1.

Referring to FIGS. 1 and 2, the voltage generating circuit 510 generates the first voltage VSS1 and the second voltage VSS2 based on a switching voltage SW.

The voltage generating circuit 510 includes a first charge pumping part 511 and a second charge pumping part 513. The second charge pumping part 513 includes a varying part VP1.

The first charge pumping part 511 has a first reference terminal REF1, a first input terminal I1 and a first output terminal O1, and the second charge pumping part 513 includes a second reference terminal REF2, a second input terminal I2 and a second output terminal O2. The varying part VP1 is electrically disposed between the first output terminal O1 and the second reference terminal REF2, as shown in FIG. 2. When the switching voltage SW is applied to the first input terminal I1 and the second input terminal I2, the first voltage VSS1 is outputted through the first output terminal O1 and the second voltage VSS2 is outputted through the second output terminal O2.

The charge pumping part 511 includes a first diode D1, a second diode D2 and a first capacitor C1. A first terminal of the first capacitor C1 is electrically connected between the first and second diodes D1 and D2. In the illustrated exemplary embodiment, an anode of the first diode D1 is connected to a cathode of the second diode D2. The first charge pumping part 511 may further include a second capacitor C2 connected to an anode of the second diode D2.

A cathode of the first diode D1 represents the first reference terminal REF1, a second terminal of the first capacitor C1 represents the first input terminal I1, and an anode of the second diode D2 represents the first output terminal O1.

The first reference terminal REF1 and a second terminal of the second capacitor C2 are connected to each other to receive a reference voltage, and the first input terminal I1 may receive the switching voltage SW. Here, the reference voltage may be a ground voltage.

The charge pumping part 513 includes a third diode D3, a fourth diode D4, and a third capacitor C3. A first terminal of the third capacitor C3 is electrically connected between the third and fourth diodes D3 and D4. In the illustrated exemplary embodiment, an anode of the third diode D3 is connected to a cathode of the fourth diode D4. The second charge pumping part 513 may further include a fourth capacitor C4 connected to an anode of the fourth diode D4.

A cathode of the third diode D3 represents the second reference terminal REF2, a second terminal of the third capacitor C3 represents the second input terminal I2, and an anode of the fourth diode D4 represents the second output terminal O2.

The second charge pumping part 513 may further include a fifth capacitor C5 including a first terminal connected to the second reference terminal REF2 and a second terminal connected to the first reference terminal REF1 of the first charge pumping part 511. Thus, a second terminal of the fifth capacitor C5 and a second terminal of the fourth capacitor C4 may be grounded. Moreover, the switching voltage SW may be applied to the second input terminal I2.

The varying part VP1 electrically connected between the second reference terminal REF2 and the first output terminal O1 may include a first resistor R1 and a second resistor R2 that are electrically connected to each other in parallel. In the illustrated exemplary embodiment, the second resistor R2 may include a negative temperature coefficient ("NTC") thermistor as a varying resistor. Where the second resistor R2 includes a NTC thermistor as a varying resistor, since the first resistor R1 is a fixed resistor, a parallel resistance of the first resistor R1 and the second resistor R2 may be designed to have a smaller resistance than a resistance of the first resistor R1, even though a resistance of the NTC thermistor is great. That is, the first resistor R1 may play a role of stabilizing voltage when a resistance value of the NTC thermistor, that is, the second resistor R2, is varied.

The switching voltage SW may be a pulse width modulation ("PWM") signal having a level of about 0 volt (V) to about 7 volts (V).

In one exemplary embodiment, for example, the first voltage VSS1 of about −5.4 V is outputted through the first output terminal O1. A second reference voltage of about −4.1 V is applied to the second reference terminal REF2 by the varying part VP1, and the second voltage VSS2 of about −9.5 V is outputted through the second output terminal O2.

Where the second voltage VSS2 of about −9.5 V is outputted through the second output terminal O2 as described above, the first and second resistors R1 and R2 are deteriorated or a temperature of the second resistor R2 is increased over time, so that resistance values of the first and second resistors R1 and R2 are decreased. As a result, due to an aging of the voltage generating circuit 510, the second voltage VSS2 may be about −10.5 V.

Figure 3:
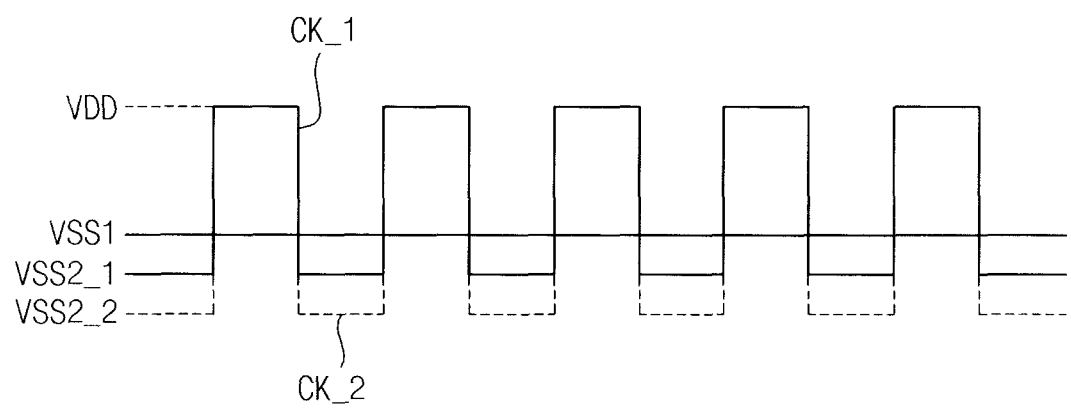
FIG. 3 is a waveform diagram showing an exemplary embodiment of a clock signal generated by using a second voltage of FIG. 2.

FIG. 3 is a waveform diagram showing an exemplary embodiment a clock signal generated by using a second voltage of FIG. 2.

Referring to FIGS. 1 to 3, the clock signal generating part 590 receives a high voltage VDD generated at the high voltage generating circuit 570 and a second voltage VSS2 generated at the voltage generating circuit 510, and generates a clock signal CK repeatedly which has the high voltage VDD and the second voltage VSS2.

In this case, the first voltage VSS1 generated by the voltage generating circuit 510 may be in a range of about −5.4 V to about −5.6 V, and the second voltage VSS2 may be temporarily varied.

Where the clock signal generating part 590 generates a clock signal CK repeatedly which has the high voltage VDD and the second voltage VSS2 as described above, the clock signal CK may be represented as an initial clock signal CK_1 when the gate drive circuit 200 is initially driven, and the clock signal CK may be represented as a latter clock signal CK_2 after an aging of the gate drive circuit 200. The aging of the gate drive circuit 200 may refer to a driving of about 3,000 hours after an initial driving.

In one exemplary embodiment, for example, the second voltage VSS2 of the initial clock signal CK_1 has a second initial voltage VSS2_1 when the gate drive circuit 200 is initially driven. In this case, the second initial voltage VSS2_1 may be in a range of about −8.3 V to about −9.8 V.

As the gate drive circuit 200 is driven and time elapses, the second voltage VSS2 of the clock signal CK is gradually decreased to be smaller than the second initial voltage VSS2_1. Then, the clock signal CK is the latter clock signal CK_2, and the second voltage VSS2 is a second latter voltage VSS2_2. In this case, the second latter voltage VSS2_2 is about −10.5 V.

As a result, the second latter voltage VSS2_2 is lower than a second initial voltage VSS2_1. It is because a resistance of the second resistor R2 that is a negative NTC thermistor is decreased, and a combined resistance of the first and second resistors R1 and R2 that are connected in parallel with each other is decreased, when a temperature of the voltage generating circuit 500 is increased over time.

Figure 4:
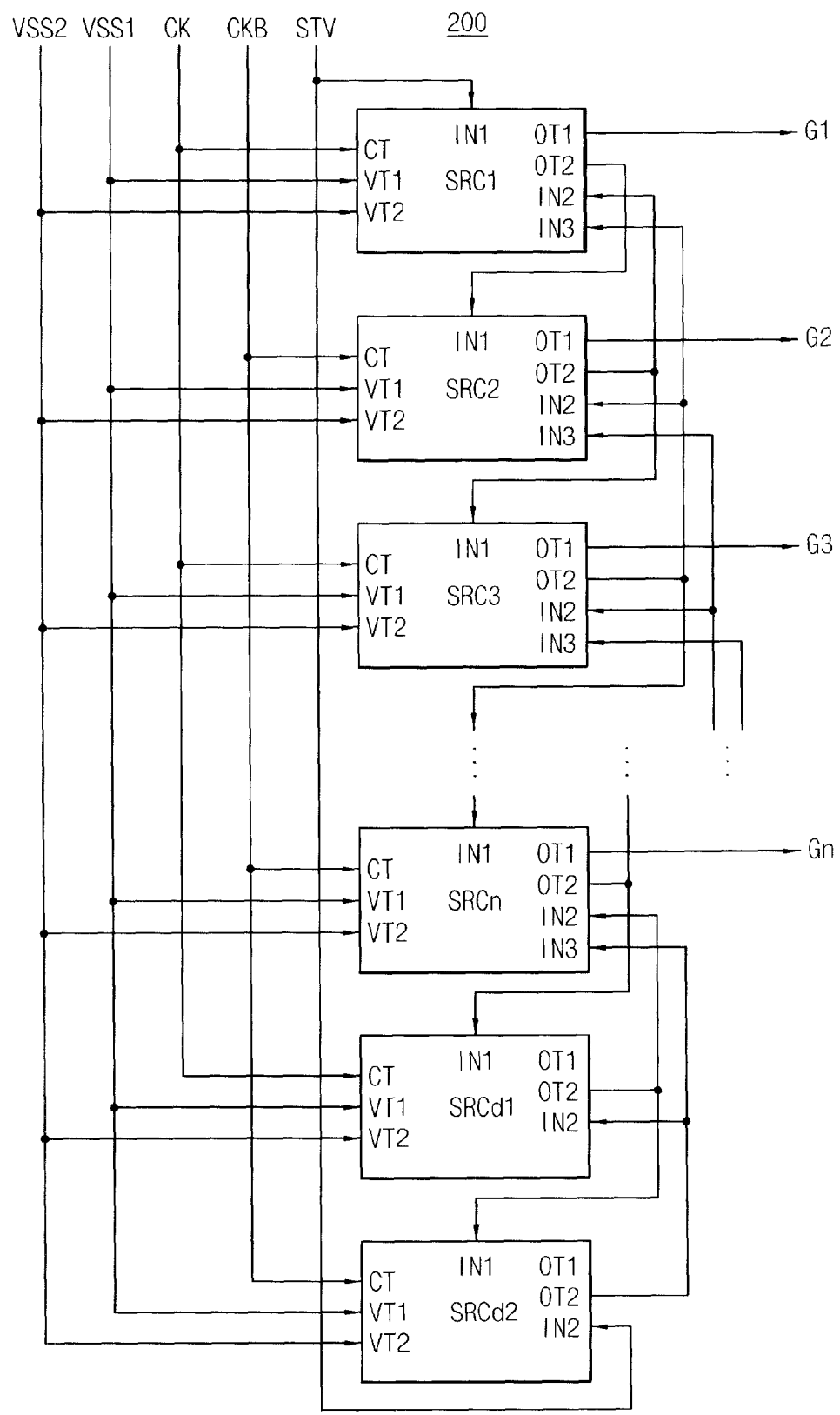
FIG. 4 is a block diagram showing an exemplary embodiment of the gate driving circuit of FIG. 1.

FIG. 4 is a block diagram showing an exemplary embodiment of the gate driving circuit of FIG. 1.

Referring to FIGS. 1 and 4, the gate drive circuit 200 includes a shift register including first to n-th stages SRC1~SRCn that are connected one after another to each other, a first dummy stage SRCd1 and a second dummy stage SRCd2.

The first to n-th stages SRC1~SRCn are connected to n gate lines, respectively, to sequentially output n gate signals to the gate wirings. The first and second dummy stages SRCd1 and SRCd2 control a driving of the n-th stage SRCn. In the illustrated exemplary embodiment, the first and second dummy stages SRCd1 and SRCd2 are not connected to the gate wirings.

Each of the stages includes a clock terminal CT, a first input terminal In1, a second input terminal IN2, a third input terminal IN3, a first voltage terminal VT1, a second voltage terminal VT2, a first output terminal OT1 and a second output terminal OT2.

The clock terminal CT receives a clock signal CK, or a clock signal having a phase opposite to the clock signal CK. In one exemplary embodiment, for example, the clock terminal CT may receive an opposite clock signal CKB having a phase opposite to the clock signal CK. Additionally, for example, the clock terminals CTs of odd-numbered stages SRC1, SRC3, . . . , SRCd1 receive the clock signal CK, and the clock terminals CTs of even-numbered stages SRC2, SRC4, . . . , SRCd2 receive the opposite clock signal CKB. The clock signal CK may be defined by a high voltage VDD and the second voltage VSS2. Here, the second voltage VSS2 after the gate drive circuit 200 is initially driven, is greater than the second voltage VSS2 after the gate drive circuit 200 is aged.

The first input terminal IN1 receives a vertical start signal STV or a carry signal of a previous stage. In one exemplary embodiment, for example, in a case of a first stage, the first input terminal IN1 of the first stage SRC1 receives the vertical start signal STV, and the first input terminals IN1 of the second to n-th stages, the first dummy stage and the second dummy stage SRC2~SRCn, SRCd1 and SRCd2 receive a carry signal of a previous stage, respectively.

The second input terminal IN2 receives a carry signal of a following stage or a vertical start signal STV. The second input terminal IN2 of the first to n-th stages SRC1~SRCn and the first dummy stage SRCd1 receive an output signal of a following stage, respectively, the second input terminal IN2 of the second dummy stage STV receives the vertical start signal STV. The vertical start signal STV received at the second input terminal IN2 of the second dummy stage SRCd2 may be a vertical start signal corresponding to a following frame.

The third input terminal IN3 receives a carry signal of a next following stage. The third input terminals IN3 of the first to n-th stages SRC1~SRCn receive a carry signal of a next following stage. The first and second dummy stages SRCd1 and SRCd2 do not include the third input terminal IN3.

A first voltage terminal VT1 of each of the first to n-th stages SRC1~SRCn, the first dummy stage SRCd1 and the second dummy stage SRCd2 receives the first voltage VSS1. The first voltage VSS1 has a first low level. The first low level may be about −5.4 V to about −5.6 V. The first low level corresponds to a discharge level of a gate signal.

The second voltage terminal VT2 of each of the first to n-th stages SRC1~SRCn, the first dummy stage SRCd1 and the second dummy stage SRCd2 receives a second voltage VSS2 having a second low level, that is lower than the first low level. The second low level is about −8.3 V to about −10.5 V. The second low level corresponds to a voltage of a first node Q included in the stage (hereinafter, referred to as Q node), the vertical start signal STV, the carry signal and a discharge level of the clock signal CK.

The first output terminal OT1 is electrically connected to a corresponding gate wiring G1~Gn, to output a gate signal. That is, the first output terminals OT1 of the first to n-th stages SRC1~SRCn are respectively connected to n gate wirings, G1~Gn, to sequentially output n gate signals to the gate wirings G1~Gn. As illustrated in FIG. 4, the first output terminals OT1 of the first and second dummy stages SRCd1 and STCd2 may be electrically floated.

The second output terminal OT2 of each of the first to n-th stages SRC1~SRCn, the first dummy stage SRCd1 and the second dummy stage SRCd2 outputs the carry signal. The second output terminal OT2 is electrically connected to the first input terminal IN1 of a directly following stage, is electrically connected to the second input terminal IN2 of a directly previous stage, and is electrically connected to the third input terminal IN3 of a second previous stage.

Figure 5:
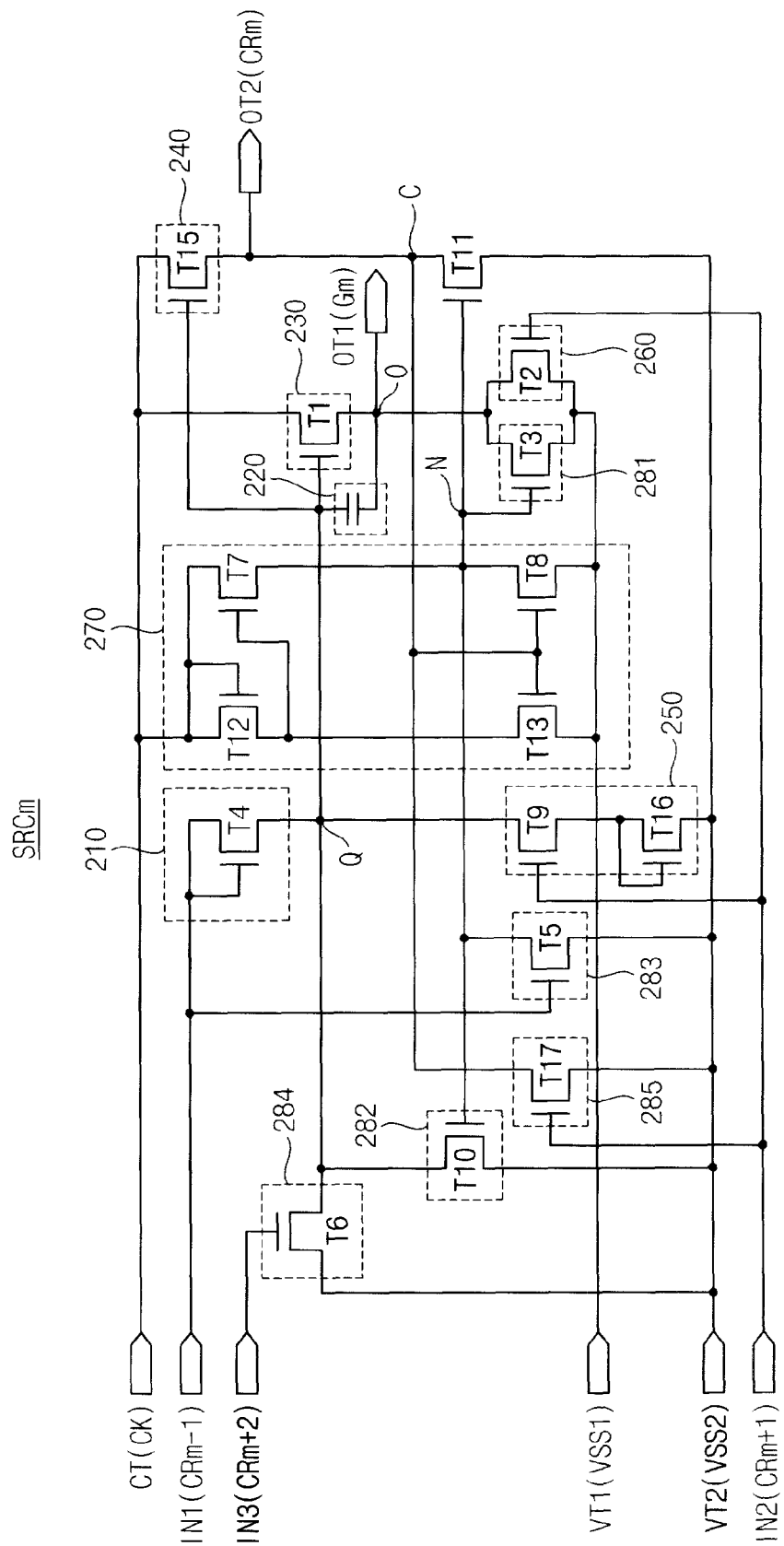
FIG. 5 is a circuit diagram showing an exemplary embodiment of a stage of FIG. 4.
Figure 6:
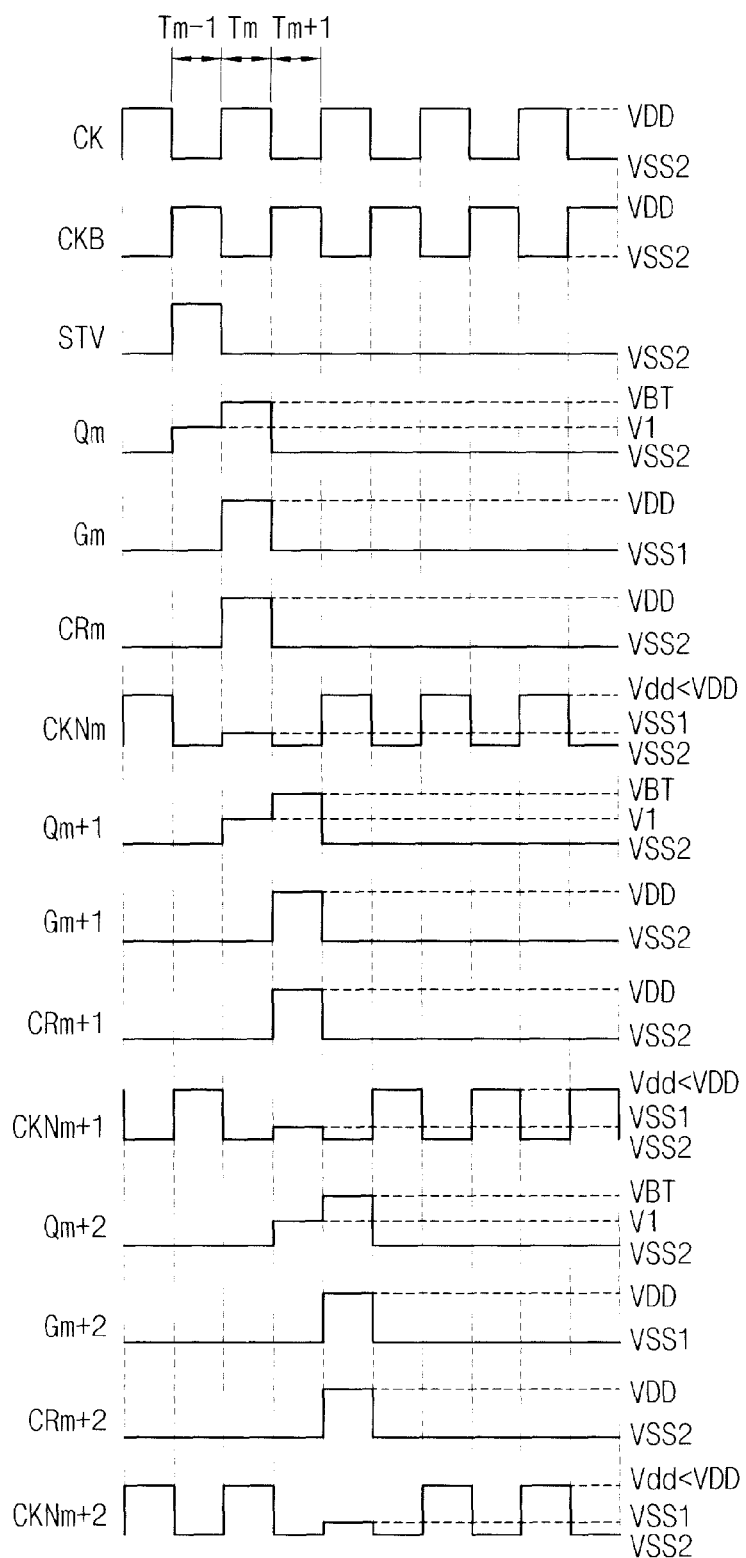
FIG. 6 is waveform diagrams showing an exemplary embodiment of input/output signals of the gate driving circuit of FIG. 4.

FIG. 5 is a circuit diagram showing an exemplary embodiment of a stage of FIG. 4. FIG. 6 is waveform diagrams showing an exemplary embodiment of input/output signals of the gate driving circuit of FIG. 4.

Referring to FIGS. 4 to 6, an m-th stage SRCm includes a buffer part 210, a charging part 220, a pull-up part 230, a carry part 240, a discharging part 250, a pull-down part 260, a switching part 270, a first maintaining part 281, a second maintaining part 282, a third maintaining part 283, a fourth maintaining part 284 and a fifth maintaining part 285.

The buffer part 210 includes a fourth transistor T4. The fourth transistor T4 includes a control part and an input part that are connected to the first input terminal IN1 receiving (m−1)-th carry signal CRm−1, and an output part connected to a Q node Q. The Q node is connected to a first terminal of the charging part 220. When the buffer part 210 receives a high voltage VDD of the vertical signal STV, the charging part 220 is charged with a first voltage V1 corresponding to the high voltage VDD.

The pull-up part 230 includes a first transistor T1. The first transistor T1 includes a control part connected to the Q node Q, an input part connected to the clock terminal CT, and an output part connected to an output node O. A control part of the pull-up part 230 is connected to a first terminal of the charging part 220, and the output node O is connected to the first output terminal OT1. A first terminal of the charging part 220 is connected to the Q node Q, and a second terminal of the charging part 220 is connected to the output node O.

When a high voltage VDD of the clock signal CK is received at the clock terminal CT in a state that a first voltage V1 charged at the charging part 220 is applied to a control part of the pull-up part 230, the pull-up part 230 is bootstrapped. In this case, the Q node Q connected to the control part of the pull-up part 230 is boosted from the first voltage V1 to a boosting voltage VBT. That is, the Q node Q has the first voltage V1 at an (m−1)-th interval Tm−1, and the boosting voltage VBT at an m-th interval Tm.

During the m-th interval Tm in which the boosting voltage VBT is applied to the control part of the pull-up part 230, the pull-up part 230 outputs the high voltage VDD of the clock signal CK as a high voltage VDD of the m-th gate signal Gm.

The carry part 240 includes a fifteenth transistor T15. The fifteenth transistor T15 includes a control part connected to the Q node Q, an input part connected to the clock terminal CT, and an output part connected to a second output terminal OT2. When a high voltage is applied to the Q node Q, the second carry part 240 outputs a high voltage VDD of the clock signal CK received at the clock terminal CT as an m-th carry signal CRm.

The discharging part 250 includes a ninth transistor T9 and a sixteenth transistor T16. The ninth transistor T9 includes a control part connected to the second input terminal IN2, an input part connected to the Q node Q, and an output part connected to the sixteenth transistor T16. The sixteenth transistor T16 includes a control part and an input part that are commonly connected to the output part of the ninth transistor T9, and an output part connected to a second voltage terminal VT2. When an (m+1)-th carry signal CRm+1 is received through the second input terminal IN2 of the discharging part 250, the discharging part 250 discharges a voltage of the Q node Q to the second voltage VSS2 applied to the second voltage terminal VT2.

In this case, the second voltage VSS2 after the gate drive circuit 200 is driven is greater than the second voltage VSS2 after the gate drive circuit 200 is aged. Thus, since a difference between the first voltage VSS1 and the second voltage VSS2 is small after the gate drive circuit 200 is driven, a leakage current of the ninth transistor T9 may be reduced. Therefore, initial driving defects may be reduced or effectively prevented, which will be generated due to that a bootstrap of the Q node Q is not normally completed.

The pull-down part 260 includes a second transistor T2. The second transistor T2 includes a control part connected to the second input terminal IN2, an input part connected to the output node O, and an output part connected to the first voltage terminal VT1. In one exemplary embodiment, for example, in the second transistor T2, the control part, the input part and the output part are a gate, a source and a drain, respectively. When the (m+1)-th carry signal CRm+1 is received at the second input terminal IN2, the pull-down part 260 discharges a voltage of the output node O into the first voltage VSS1 applied to the first voltage terminal VT1.

The switching part 270 includes a twelfth transistor T12, a seventh transistor T7, a thirteenth transistor T13 and an eighth transistor T8. A control part and an input part of the twelfth transistor T12 are connected to the clock terminal CT, and an output part of the twelfth transistor T12 is connected to an input part of the thirteenth transistor T13 and the seventh transistor T7. A control part of the seventh transistor T7 is connected to an output part of the twelfth transistor T12, an input part of the seventh transistor T7 is connected to the clock terminal CT, and an output part of the seventh transistor T7 is connected to an input part of the eighth transistor T8. An output part of the seventh transistor T7 is connected to an N node N. The thirteenth transistor T13 includes a control part connected to a C node C connected to the second output node OT2, an input part connected to a twelfth transistor T12, and an output part connected to the first voltage terminal VT1. The eighth transistor T8 includes a control part connected to the C node C, the input part connected to the N node N, and an output part connected to the first voltage terminal VT1.

The switching part 270 discharges the clock signal CK received at the clock terminal CT into the first voltage VSS1 applied to the first voltage terminal VT1, during an m-th interval Tm of a frame in which a high voltage is applied to the C node C. That is, the eighth and thirteenth transistors T8 and T13 are turned on in response to a high voltage applied to the C node C, and thus the clock signal CK of the N node N is discharged into the first voltage VSS1.

During the remaining interval of the frame in which a voltage is applied to the C node C, an m-th node signal CKNm is applied to the N node N, which has a phase substantially the same as that of the clock signal CK received at the clock terminal CT. That is, when a voltage is applied to the C node C, the eighth and thirteenth transistors T8 and T13 are turned on, and thus the m-th node signal CKNm having a lower level than the high voltage VDD of the clock signal CK is applied to the N node N. Since the clock signal CK is transmitted through the seventh and twelfth transistors T7 and T12 and parasitic capacitors, a high voltage Vdd of the m-th node signal CKNm is lower than a level of the high voltage VDD of the clock signal CK.

The first maintaining part 281 includes a third transistor T3. The third transistor T3 includes a control part connected to the N node N, an input part connected to the output node O, and an output part connected to the first voltage terminal VT1. The first maintaining part 281 maintains a voltage of the output node O to the first voltage VSS1 in response to the m-th node signal CKNm during the remaining interval of the frame.

The second maintaining part 282 includes a tenth transistor T10. The tenth transistor T10 includes a control part connected to the N node N, an input part connected to the Q node Q, and an output part connected to the second voltage terminal VT2. The second maintaining part 282 maintains a voltage of the Q node Q to the second voltage VSS2 in response to the m-th node signal CKNm during the remaining interval of the frame. A phase of the m-th node signal CKNm is substantially equal to that of the clock signal CK during the remaining interval of the frame.

In this case, the second voltage VSS2 after the gate drive circuit 200 is initially driven, is greater than the second voltage VSS2 after the gate drive circuit 200 is aged. Thus, since a difference between the first voltage VSS1 and the second voltage VSS2 is small after the gate drive circuit 200 is initially driven, a leakage current of the tenth transistor T10 may be reduced. Therefore, initial driving defects may be reduced or effectively prevented, which will be generated due to that a bootstrap of the Q node Q is not normally completed.

The third maintaining part 283 includes a fifth transistor T5. The fifth transistor T5 includes a control part connected to the first input terminal IN1, an input part connected to the N node N, and an output part connected to the second voltage terminal VT2. The third maintaining part 283 maintains a voltage of the N mode N to the second voltage VSS2 in response to the (m−1)-th carry signal CRm−1.

The fourth maintaining part 284 includes a sixth transistor T6. The sixth transistor T6 includes a control part connected to the third input terminal IN3, an input part connected to the Q node Q, and an output part connected to the second voltage terminal VT2. The fourth maintaining part 284 maintains a voltage of the Q node Q to the second voltage VSS2 in response to an (m+2)-th carry signal CRm+2 received at the third input terminal IN3 during the remaining interval of the frame.

In this case, the second voltage VSS2 after the gate drive circuit 200 is initially driven is greater than the second voltage VSS2 after the gate drive circuit 200 is aged. Thus, since a difference between the first voltage VSS1 and the second voltage VSS2 is small after the gate drive circuit 200 is initially driven, a leakage current of the sixth transistor T6 may be reduced. Therefore, initial driving defects may be reduced or effectively prevented, which will be generated due to that a bootstrap of the Q node Q is not normally completed.

The fifth maintaining part 285 includes a seventeenth transistor T17. The seventeenth transistor T17 includes a control part connected to the second input terminal IN2, an input part connected to the Q node Q, and an output part connected to the second voltage terminal VT2. The fifth maintaining part 285 maintains a voltage of the Q node Q to the second voltage VSS2 in response to an (m+1)-th carry signal CRm+1 during the remaining interval of the frame.

As a result, according to the illustrated exemplary embodiment, an interval voltage between the first voltage VSS1 and the second voltage VSS2 is decreased when the gate drive circuit 200 is initially driven, power consumption of the gate drive circuit 200 may be decreased. In addition, leakage current of the sixth transistor T6, the ninth transistor T9 and the tenth transistor T10 may be reduced or effectively prevented, which will be generated when the gate drive circuit 200 is initially driven. Thus, initial driving defects such as low temperature defects may be reduced or effectively prevented, which will be generated due to that a bootstrap of the Q node Q is not normally completed.

When the gate drive circuit 200 is aged, the interval voltage between the first voltage VSS1 and the second voltage VSS2 is increased so that it may maintain a gate/source voltage VGS of the pull-up part 230 to a negative status. Accordingly, a high temperature margin may be secured.

Figure 7:
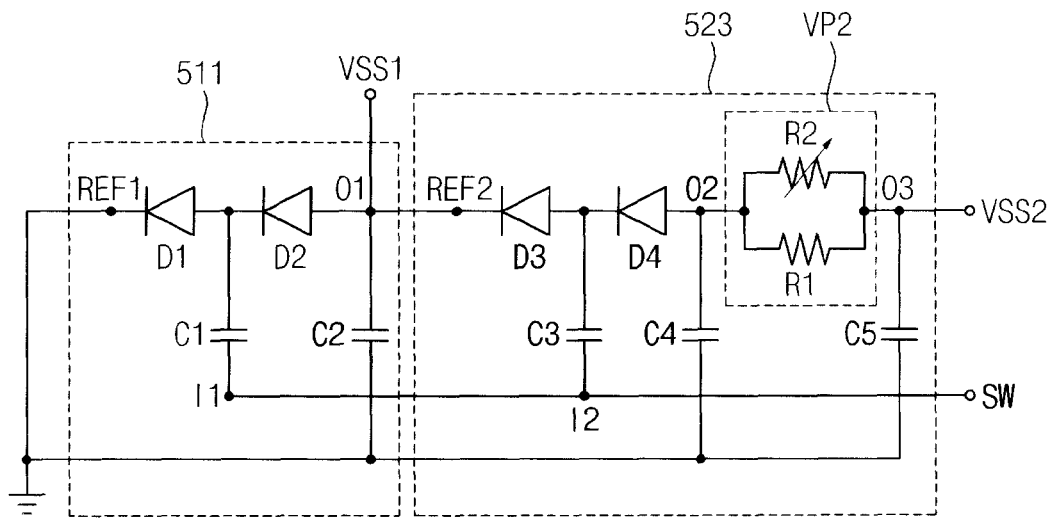
FIG. 7 is a circuit diagram showing another exemplary embodiment of a voltage generating circuit, according to the invention.

FIG. 7 is a circuit diagram showing another exemplary embodiment of a voltage generating circuit, according to the invention.

In the illustrated exemplary embodiment, a waveform diagram of a clock signal, a gate drive circuit, a plurality of stages included in the gate drive circuit and waveform diagrams of input/output signals of the gate drive circuit are substantially the same as in FIGS. 3, 4, 5 and 6. Thus, any further explanations concerning the above will be omitted.

The display apparatus according to the illustrated exemplary embodiment is substantially the same as the display apparatus of FIG. 1 except that the display apparatus according to the illustrated exemplary embodiment includes the voltage generating circuit 520 instead of the voltage generating circuit 510 of FIG. 2, and thus any repetitive detailed description thereof will be omitted.

Referring to FIGS. 1, 2 and 7, the voltage generating circuit 520 generates the first voltage VSS1 and the second voltage VSS2 based on a switching voltage SW.

The voltage generating circuit 520 includes a first charge pumping part 511 and a second charge pumping part 523. The second charge pumping part 523 includes a varying part VP2.

The second charge pumping part 523, and the voltage generating circuit 520 including the second charge pumping part 523 are substantially the same as the second charge pumping part 513 and the voltage generating circuit 510 including the second charge pumping part 513 of FIG. 2, except that the varying part VP2 and the fifth capacitor C5 are disposed at the second output terminal O2 instead of between the first output terminal O1 and the second reference terminal REF2, and thus any repetitive detailed explanation may hereinafter be omitted.

Since the varying part VP2 is connected to the second output terminal O2 in series, an output terminal O3 of the varying part VP2 outputs the second voltage VSS2.

The first and second voltages VSS1 and VSS2 according to the illustrated exemplary embodiment are substantially the same as the first and second voltages VSS1 and VSS2 according to the exemplary embodiment in FIGS. 2-6, and an effect in accordance with the illustrated exemplary embodiment of FIG. 7 is equal to an effect in accordance with the exemplary embodiment in FIGS. 2-6. Thus, a detailed description thereof will be omitted.

Figure 8:
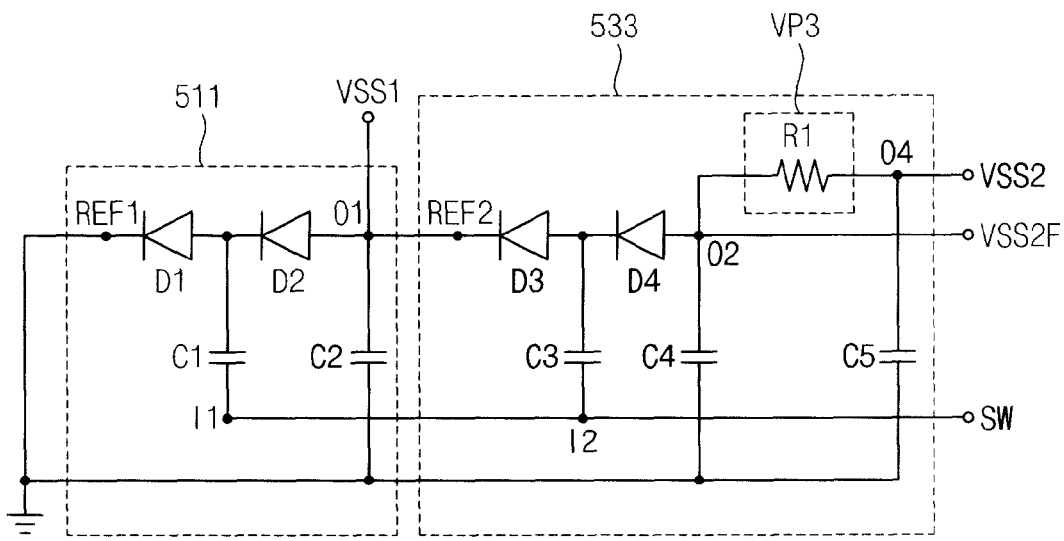
FIG. 8 is a circuit diagram showing another exemplary embodiment of a voltage generating circuit, according to the invention.

FIG. 8 is a circuit diagram showing another exemplary embodiment of a voltage generating circuit, according to the invention.

The gate drive circuit and the stage included in the gate drive circuit according to the illustrated exemplary embodiment, are substantially the same as the gate drive circuit and the stage included in the gate drive circuit of FIGS. 4 and 5, except that a low level of each of clock signals CK is a third voltage VSS2F that is a fixed voltage, instead of the second voltage VSS2 that is varied in accordance with a time, and thus a detailed description thereof will be omitted.

The display apparatus according to the illustrated exemplary embodiment is substantially the same as the display apparatus of FIG. 1 except that the display apparatus according to the illustrated exemplary embodiment includes the voltage generating circuit 530 instead of the voltage generating circuit 510 of FIG. 2, and thus any repetitive detailed description thereof will be omitted.

Referring to FIGS. 1, 2 and 8, the voltage generating circuit 530 generates the first voltage VSS1 and the second voltage VSS2 based on the switching voltage SW.

The voltage generating circuit 530 includes a first charge pumping part 511 and a second charge pumping part 533. The second charge pumping part 533 includes a varying part VP3.

The second charge pumping part 533, and the voltage generating circuit 530 including the second charge pumping part 533 are substantially the same as the second charge pumping part 513 and the voltage generating circuit 510 including the second charge pumping part 513 of FIG. 2, except that the varying part VP3 and the fifth capacitor C5 are disposed at the second output terminal O2 instead of between the first output terminal O1 and the second reference terminal REF2, the varying part VP3 only includes a first resistor R1 that is a fixed resistor, and the second output terminal O2 outputs the third voltage VSS2F. Thus, any repetitive detailed explanation may hereinafter be omitted.

Since the varying part VP3 is connected to the second output terminal O2 in series, the output terminal O4 of the varying part VP3 outputs the second voltage VSS2.

Moreover, the third voltage VSS2F that is an output of the second output terminal O2, is provided to the clock signal generating circuit 590, and thus the third voltage VSS2F may be used as a low level of the clock signal CK.

Figure 9:
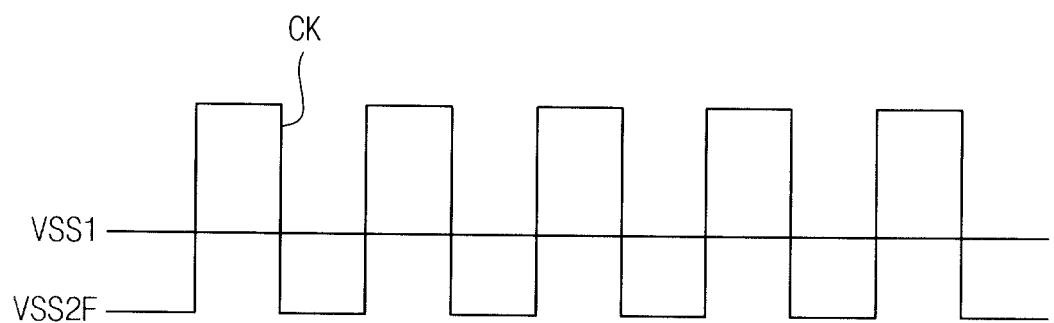
FIG. 9 is a waveform diagram showing an exemplary embodiment of a clock signal generated by using the third voltage of FIG. 8.

FIG. 9 is a waveform diagram showing an exemplary embodiment of a clock signal generated by using the third voltage VSS2F of FIG. 8.

Referring to FIGS. 6, 8 and 9, the clock signal CK repeatedly has a high voltage VDD and a third voltage VSS2F. Where the second voltage VSS2 of the exemplary embodiment in FIGS. 2-6 is varied in accordance with a time, e.g., VSS2_1 and VSS2_2. However, the third voltage VSS2F of the illustrated exemplary embodiment is uniform in accordance with a time.

In one exemplary embodiment, for example, the third voltage VSS2F of the clock signal CK may be in a range of about −10.7 V to about −11.2 V regardless of time.

Figure 10:
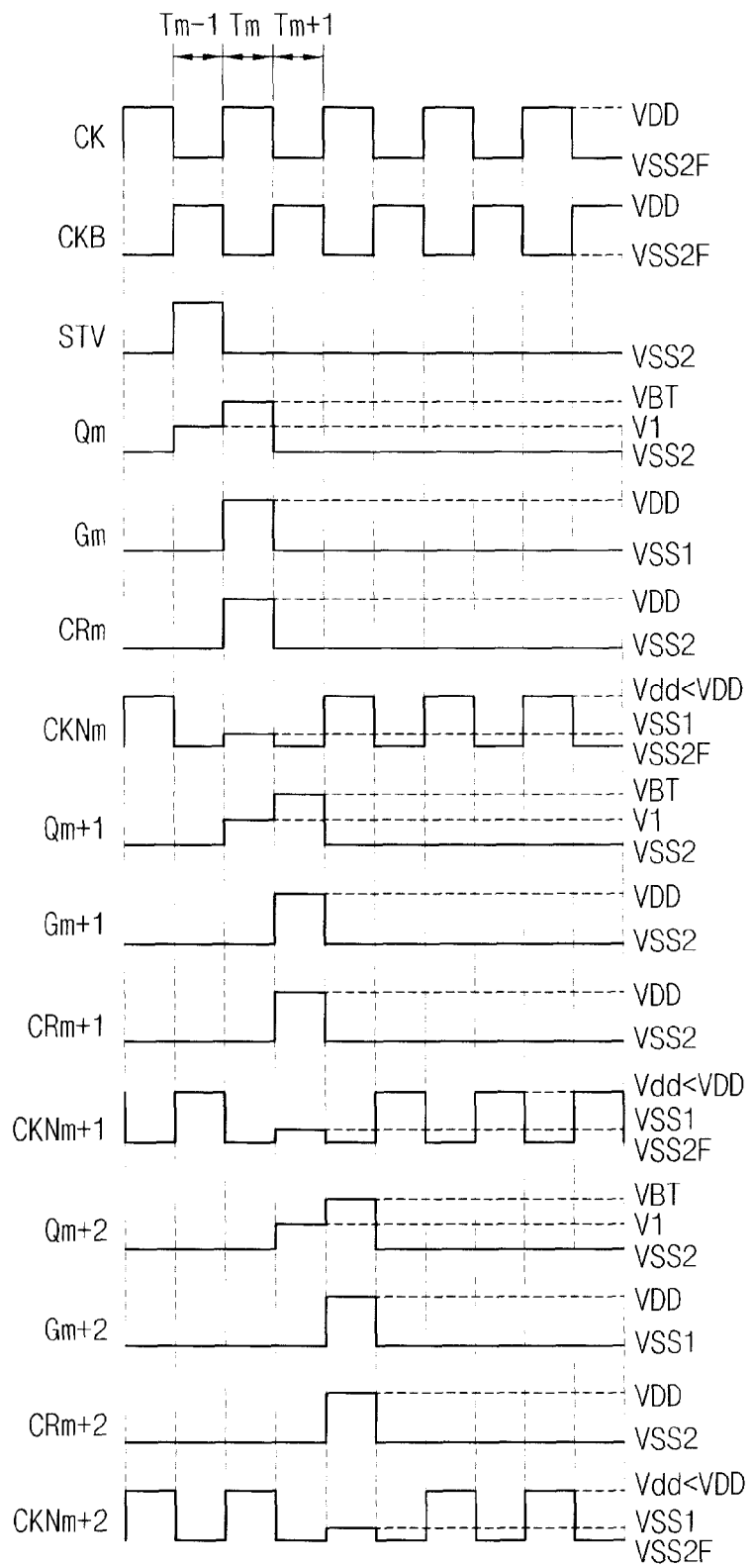
FIG. 10 is waveform diagrams showing an exemplary embodiment of input/output signals of a gate driving circuit which uses output voltages of FIG. 8.

FIG. 10 is waveform diagrams showing an exemplary embodiment of input/output signals of a gate driving circuit which uses output voltages of FIG. 8

Referring to FIGS. 5, 6, 8 and 10, since a low level of the clock signal CK is the third voltage VSS2F, a low level of an m-th node signal CKNm, which is applied to the N node N by the switching part 270 for the remaining interval of a frame, may be the third voltage VSS2F.

In the illustrated exemplary embodiment, the NTC thermistor may be omitted, which is included in the voltage generating circuit of FIGS. 2-6 and FIG. 7.

When the voltage generating circuit includes the NTC thermistor, an inverse voltage higher than a voltage of the first output terminal O1 may be applied to the second output terminal O2 in accordance with a resistance of the NTC thermistor.

That is, where the voltage generating circuit acc does not include the NTC thermistor, leakage current of the sixth, ninth and tenth transistors T6, T9 and T10 is reduced or effectively prevented. In addition, power consumption of the gate drive circuit 200 may be decreased and a high temperature margin may be secured.

Figure 11:
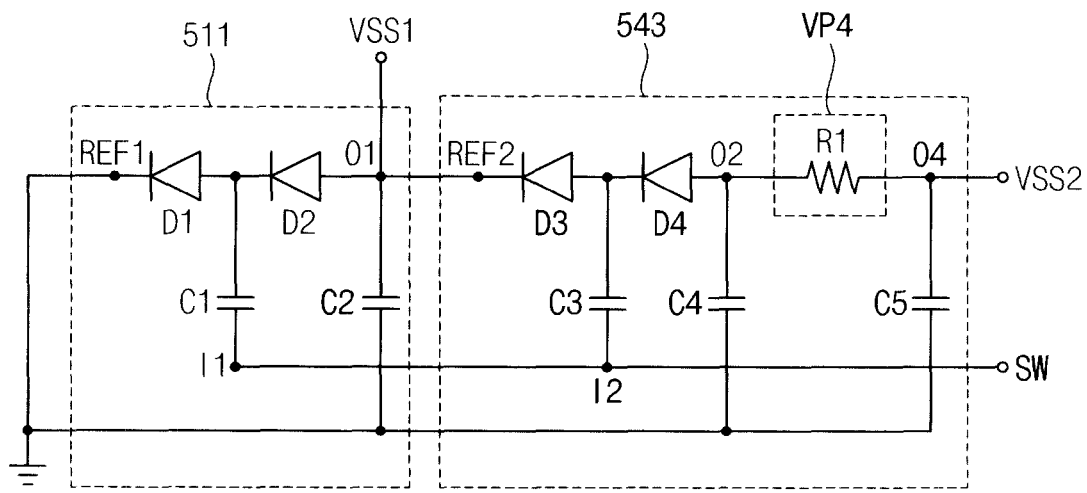
FIG. 11 is a circuit diagram showing another exemplary embodiment of a voltage generating circuit, according to the invention.

FIG. 11 is a circuit diagram showing another exemplary embodiment of a voltage generating circuit, according to the invention In the illustrated exemplary embodiment, a waveform diagram of a clock signal, a gate drive circuit, a plurality of stages included in the gate drive circuit and waveform diagrams of input/output signals of the gate drive circuit are substantially the same as in FIGS. 3, 4, 5 and 6. Thus, any further explanations concerning the above will be omitted.

The display apparatus according to the illustrated exemplary embodiment is substantially the same as the display apparatus of FIG. 1 except that the display apparatus according to the illustrated exemplary embodiment includes the voltage generating circuit 540 instead of the voltage generating circuit 510 of FIG. 2, and thus any repetitive detailed description thereof will be omitted.

Referring to FIGS. 1, 2 and 11, the voltage generating circuit 540 generates the first voltage VSS1 and the second voltage VSS2 based on the switching voltage SW.

The voltage generating circuit 540 includes a first charge pumping part 511 and a second charge pumping part 543. The second charge pumping part 543 includes a varying part VP4.

The second charge pumping part 543 and the voltage generating circuit 540 including the second charge pumping part 543 are substantially the same as the second charge pumping part 513 and the voltage generating circuit 510 including the second charge pumping part 513 of FIG. 2, except that the varying part VP4 and the fifth capacitor C5 are disposed at the second output terminal O2 instead of between the first output terminal O1 and the second reference terminal REF2, and the varying part VP4 only includes only a first resistor R1 that is a fixed resistor. Thus, any repetitive detailed explanation may hereinafter be omitted.

Since the varying part VP4 is connected to the second output terminal O2 in series, the output terminal O4 of the varying part VP4 outputs the second voltage VSS2.

According to the illustrated exemplary embodiment, an interval voltage between the first voltage VSS1 and the second voltage VSS2 is decreased when the gate drive circuit 200 is initially driven, power consumption of the gate drive circuit 200 may be decreased. In addition, initial driving defects such as low temperature defects may be prevented, which will be generated due to that a bootstrap of the Q node Q is not normally completed.

Moreover, when the gate drive circuit 200 is aged, an interval voltage between the first voltage VSS1 and the second voltage VSS2 is increased so that a high temperature margin may be secured.

Furthermore, the voltage generating circuit 540 may have a simple structure rather than the voltage generating circuit of the previous exemplary embodiments in FIGS. 2-10.

Figure 12:
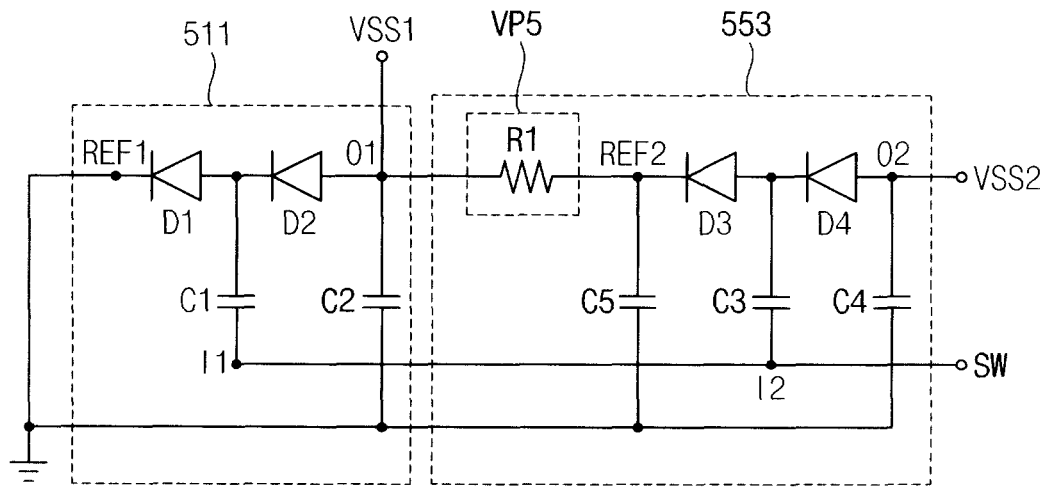
FIG. 12 is a circuit diagram showing another exemplary embodiment of a voltage generating circuit, according to the invention.

FIG. 12 is a circuit diagram showing another exemplary embodiment of a voltage generating circuit, according to the invention.

In the illustrated exemplary embodiment, a waveform diagram of a clock signal, a gate drive circuit, a plurality of stages included in the gate drive circuit and waveform diagrams of input/output signals of the gate drive circuit are substantially the same as in FIGS. 3, 4, 5 and 6. Thus, any further explanations concerning the above will be omitted.

The display apparatus according to the illustrated exemplary embodiment is substantially the same as the display apparatus of FIG. 1 except that the display apparatus according to the illustrated exemplary embodiment includes the voltage generating circuit 550 instead of the voltage generating circuit 510 of FIG. 2, and thus any repetitive detailed description thereof will be omitted.

Referring to FIGS. 1, 2 and 12, the voltage generating circuit 550 generates the first voltage VSS1 and the second voltage VSS2 based on the switching voltage SW.

The voltage generating circuit 550 includes a first charge pumping part 511 and a second charge pumping part 553. The second charge pumping part 553 includes a varying part VP5.

The second pumping part 553 and the voltage generating circuit 550 including the second pumping part 553, are substantially the same as the second charge pumping part 513 and the voltage generating circuit 510 including the second charge pumping part 513 of FIG. 2, except that the varying part VP5 includes only a first resistor R1 that is a fixing resistor, and thus any repetitive detailed explanation may be hereinafter omitted.

According to the illustrated, an interval voltage between the first voltage VSS1 and the second voltage VSS2 is decreased when the gate drive circuit 200 is initially driven, and power consumption of the gate drive circuit 200 may be decreased. In addition, initial driving defects such as low temperature defects may be prevented, which will be generated due to that a bootstrap of the Q node Q is not normally completed.

Moreover, when the gate drive circuit 200 is aged, an interval voltage between the first voltage VSS1 and the second voltage VSS2 is increased so that a high temperature margin may be secured.

Furthermore, similar to the exemplary embodiment in FIG. 11, the voltage generating circuit may have a simple structure rather than the voltage generating circuit of the previous exemplary embodiments in FIGS. 2-10.

Figure 13:
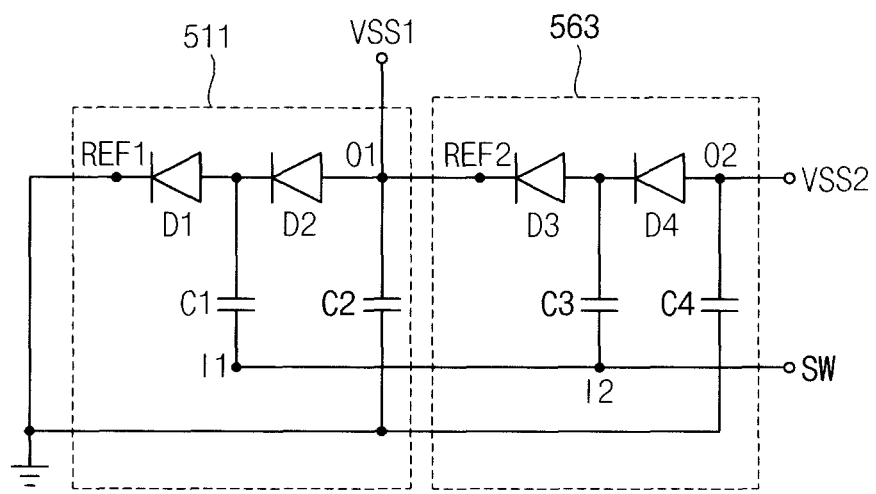
FIG. 13 is a circuit diagram showing a voltage generating circuit according to a comparative embodiment.

FIG. 13 is a circuit diagram showing a voltage generating circuit according to a comparative embodiment.

Referring to FIG. 13, a voltage generating circuit 560 according to the comparative embodiment includes a second charge pumping part 563, in which a varying part VP1 is removed from the second charge pumping part 513 of the exemplary embodiment in FIGS. 2-6, and a varying part VP5 is removed from the second charge pumping part 553 of the exemplary embodiment in FIG. 12

A sample circuit of the voltage generating circuit 560 according to a comparative embodiment was designed so that the second charge pumping part 563 outputs a second voltage VSS2 of about −10.7 V.

In the comparative embodiment, since the second charge pumping part 563 does not include a varying part, the second voltage VSS2 is not varied in accordance with time.

A sample circuit of the voltage generating circuit 510 in FIG. 2 was designed as that a resistance value of the second resistor R2 of the varying part VP1 as shown in FIG. 2 is about 10 kilo-ohms (kΩ), and a resistance value of the first resistor R1 as shown in FIG. 2 is about 360 ohms (Ω).

Figure 14A:
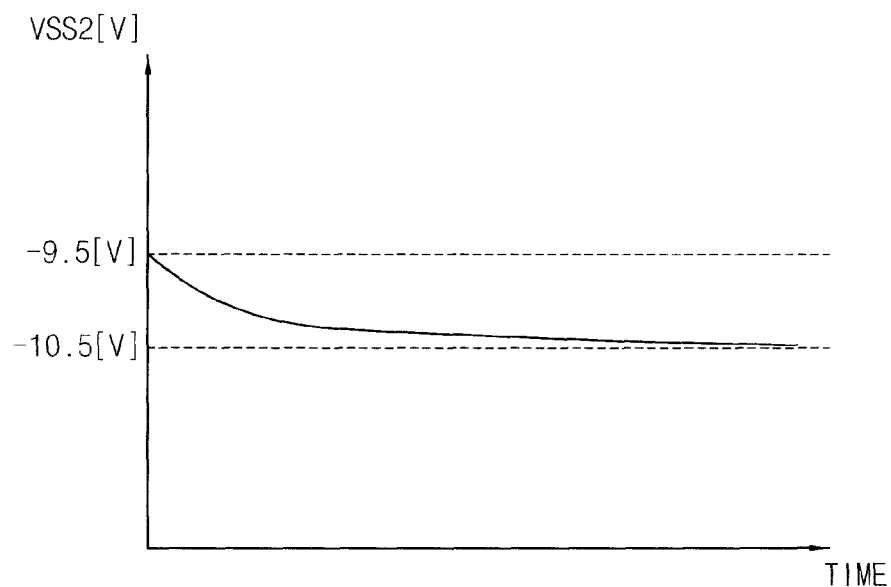
FIG. 14A is a waveform diagram showing a relationship between time and a second voltage of a sample circuit of a voltage generating circuit in FIG. 2.
Figure 14B:
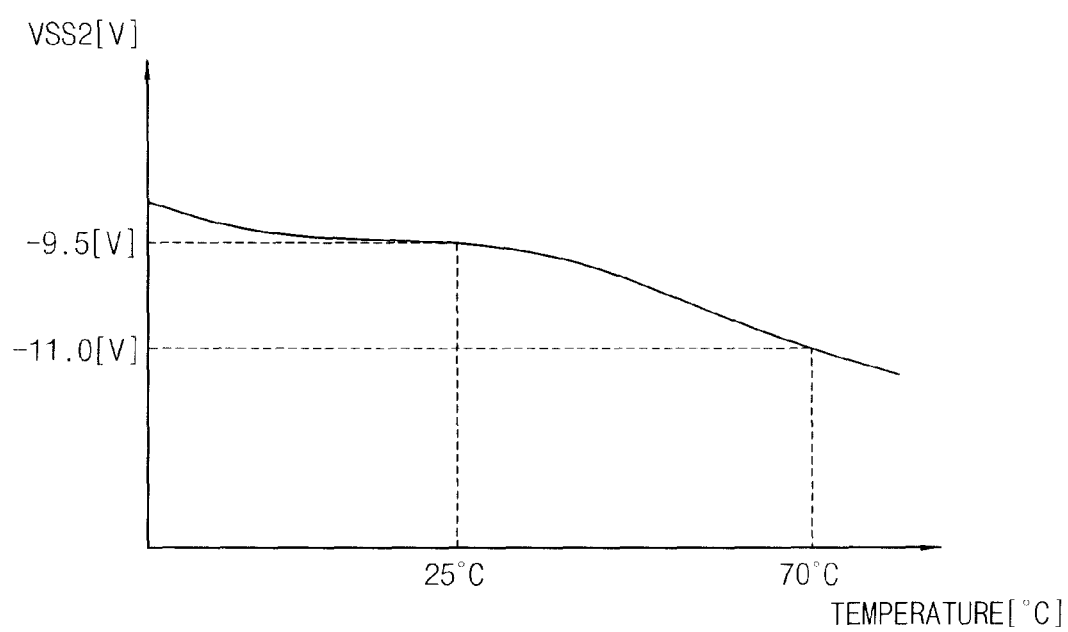
FIG. 14B is a waveform diagram showing a relationship between temperature and the second voltage of a sample circuit of a voltage generating circuit in FIG. 2.

FIG. 14A is a waveform diagram showing a relationship between time and the second voltage VSS2 of the sample circuit of the voltage generating circuit 510 in FIG. 2. FIG. 14B is a waveform diagram showing a relationship between temperature and the second voltage VSS2 of the sample circuit of the voltage generating circuit 510 in FIG. 2.

Referring to FIGS. 2 and 14A, the second voltage VSS2 was about −9.5 V when the voltage generating circuit 510 is initially driven, the second voltage VSS2 was decreased to about −10.5 V in accordance with an aging of the voltage generating circuit 510, and the second voltage VSS2 was saturated to about −10.5 V after a predetermined time.

Referring to FIGS. 2 and 14B, the second voltage VSS2 was about −9. V when a driving temperature of the voltage generating circuit 510 was about 0 degree Celsius, and the second voltage VSS2 was about −9.5 V when the driving temperature of the voltage generating circuit 510 was about 25 degrees Celsius. The second voltage VSS2 was about −11 V when the driving temperature of the voltage generating circuit 510 was about 70 degrees Celsius A first sample circuit of the voltage generating circuit 550 in FIG. 12 was designed as that a resistance value of the first resistor R1 of the varying part VP5 as shown in FIG. 12 is about 120 kΩ.

Figure 15:
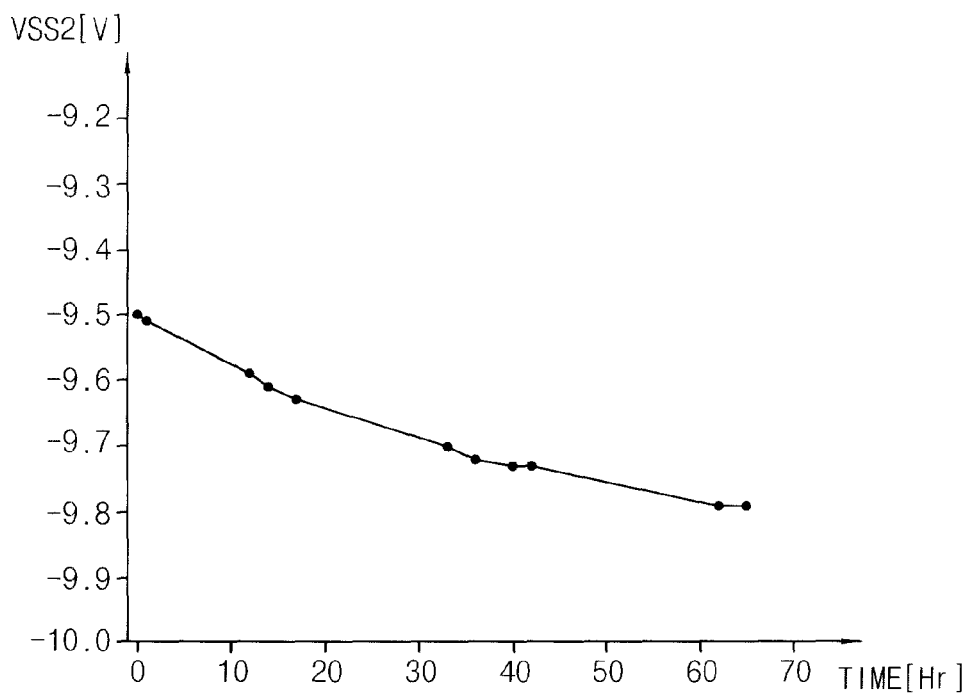
FIG. 15 is a waveform diagram showing a relationship between time and a second voltage of a first sample circuit of a voltage generating circuit in FIG. 12.

FIG. 15 is a waveform diagram showing a relationship between time and a second voltage VSS2 of the first sample circuit of the voltage generating circuit 550 in FIG. 12.

Referring to FIGS. 12 and 15, the second voltage VSS2 was about −9.5 V when the gate drive circuit 200 is initially driven, and the second voltage VSS2 was gradually decreased in accordance with an aging of the voltage generating circuit 540.

A second sample circuit of the voltage generating circuit 550 in FIG. 12 was designed as that a resistance value of the first resistor R1 of the varying part VP5 as shown in FIG. 12 is about 560 kΩn.

Figure 16:
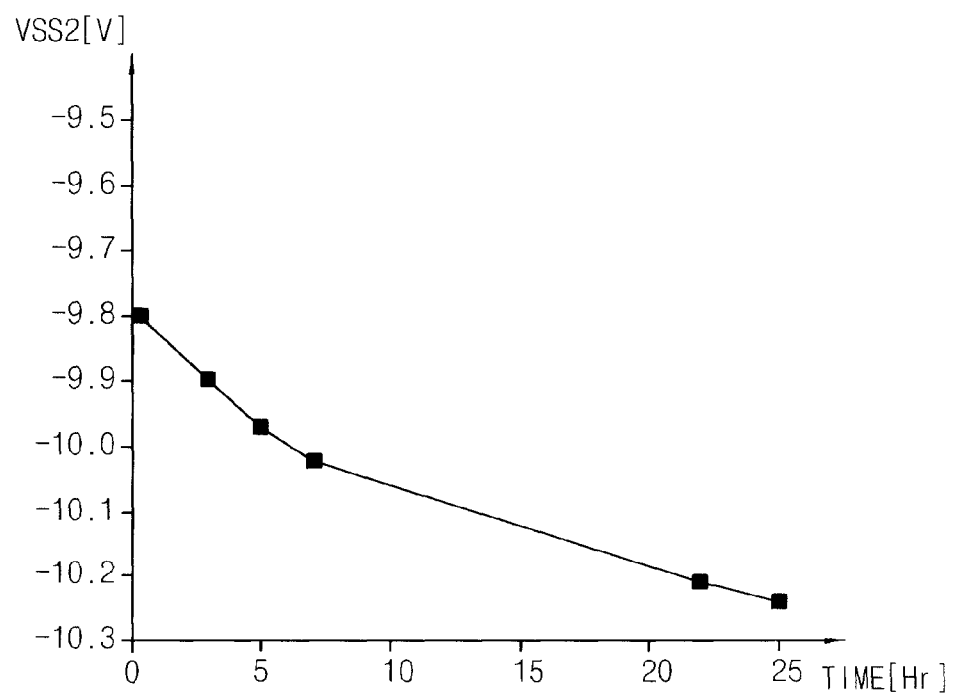
FIG. 16 is a waveform diagram showing a relationship between time and a second voltage of a second sample circuit of a voltage generating circuit in FIG. 12.

FIG. 16 is a waveform diagram showing a relationship between time and a second voltage of a second sample circuit of a voltage generating circuit according to Exemplary Embodiment 5.

Referring to FIGS. 12 and 16, the second voltage VSS2 was about −9.8V when the voltage generating circuit 550 is initially driven, and was gradually decreased in accordance with aging of the voltage generating circuit 550.

The following Table 1 shows the second voltages VSS2 generated by the sample circuit of comparative embodiment of FIG. 13, the sample circuit of FIG. 2, the first sample circuit of FIG. 12 and a second sample circuit of FIG. 12.

TABLE 1

|  | VDD [V] | VSS1 [V] | VSS2 [V] |
| --- | --- | --- | --- |
| Sample Circuit of comparative embodiment (FIG. 13) | 20.06 | −5.4 | −10.7 |

TABLE 1-continued

|  | VDD [V] | VSS1 [V] | VSS2 [V] |
| --- | --- | --- | --- |
| Sample Circuit of FIG. 2 | 20.06 | −5.4 | −9.5 |
| First Sample Circuit of FIG. 12 | 20.06 | −5.4 | −9.5 |
| Second Sample Circuit of FIG. 12 | 20.06 | −5.4 | −9.8 |

In each sample circuit above, the high voltage generating circuit 570 (FIG. 1) outputted a high voltage VDD of about 20.06 V, and the first charge pumping part 511 outputted a first voltage VSS1 of about −5.4 V.

On the basis on a voltage value of the high voltage VDD and the second voltage VSS2 described above, a power consumption of the gate drive circuit 200 in accordance with the sample circuit of comparative embodiment is compared with power consumptions of the gate drive circuit 200 in accordance with the sample circuit of FIGS. 2 and 12 detailed above.

Referring to Table 1 and FIG. 14A, the sample circuit of FIG. 2 outputted the second voltage VSS2 of about −9.5V when the gate drive circuit 200 was initially driven, however, the sample circuit of the comparative embodiment outputted the second voltage VSS2 of about −10.7V when the gate drive circuit 200 was initially driven.

When the high voltage VDD was about 20.06 V, an amplitude ΔV of a clock signal in the exemplary embodiment of FIGS. 2-6 was about 29.56. However, an amplitude ΔV of a clock signal according to the comparative embodiment was about 30.76. Thus, a decreased amount of an amplitude of a clock signal was about 4% (e.g., 29.56/30.76=0.96). A decreased amount of substantial power consumption may de defined as a following Equation 1.

[Equation 1]

$$ASG_{POWER} = C \times f \times \Delta V^2$$

Here, 'C' denotes a capacitance of the gate drive circuit 200, 'f' denotes a driving frequency, and 'ΔV' denotes an amplitude of a clock signal.

That is, a substantial decreased amount of power consumption may be determined from $\Delta V^2$.

Since a decreased amount of ΔV is about 0.96, a decreased amount of $\Delta V^2$ is about 0.92 (=0.96×0.96). Thus, a power consumption of the gate drive circuit 200 due to an output of the sample circuit according to FIGS. 2-6 may be decreased by about 8% with respect to a power consumption of a gate drive circuit 200 due to an output of the sample circuit according to the comparative embodiment.

Referring to Table 1 and FIG. 15, the first sample circuit of FIG. 12 outputted the second voltage VSS2 of about −9.5 V when the gate drive circuit 200 was initially driven, however, the sample circuit of the comparative embodiment outputted the second voltage VSS2 of about −10.7 V when the gate drive circuit 200 was initially driven.

When the high voltage VDD was about 20.06 V, an amplitude ΔV of the clock signal in the exemplary embodiment of FIG. 12 was about 29.56. However, an amplitude ΔV of the clock signal of the comparative embodiment was about 30.76. Thus, a decreasing amount of the amplitude ΔV of the clock signal was about 4% (29.56/30.76=0.96).

That is, a substantial decreased amount of power consumption may be determined from $\Delta V^2$.

Since a decreased amount of ΔV is about 0.96, a decreased amount of $\Delta V^2$ is about 0.92 (=0.96×0.96). Thus, a power consumption of the gate drive circuit 200 due to an output of the first sample circuit according to FIG. 12 may be decreased by about 8% with respect to a power consumption of a gate drive circuit 200 due to an output of the sample circuit according to the comparative embodiment.

Referring to Table 1 and FIG. 16, the second sample circuit of FIG. 12 outputted the second voltage VSS2 of about −9.8 V when the gate drive circuit 200 was initially driven, however, the sample circuit of the comparative embodiment outputted the second voltage VSS2 of about −10.7 V when the gate drive circuit 200 was initially driven.

When the high voltage VDD was about 20.06 V, an amplitude ΔV of the clock signal in the exemplary embodiment if FIG. 12 was about 29.86. However, an amplitude ΔV of the clock signal of the comparative embodiment was about 30.76. Thus, a decreasing amount of the amplitude ΔV of the clock signal was about 3% (29.86/30.76=0.97).

Moreover, a substantial decreased amount of power consumption may be determined from $\Delta V^2$.

Since a decreased amount of ΔV is about 0.96, a decreased amount of $\Delta V^2$ is about 0.94 (=0.97×0.97). Thus, a power consumption of the gate drive circuit 200 due to an output of the second sample circuit according to FIG. 12 may be decreased by about 8% with respect to a power consumption of a gate drive circuit 200 due to an output of the sample circuit according to the comparative embodiment.

Figure 17:
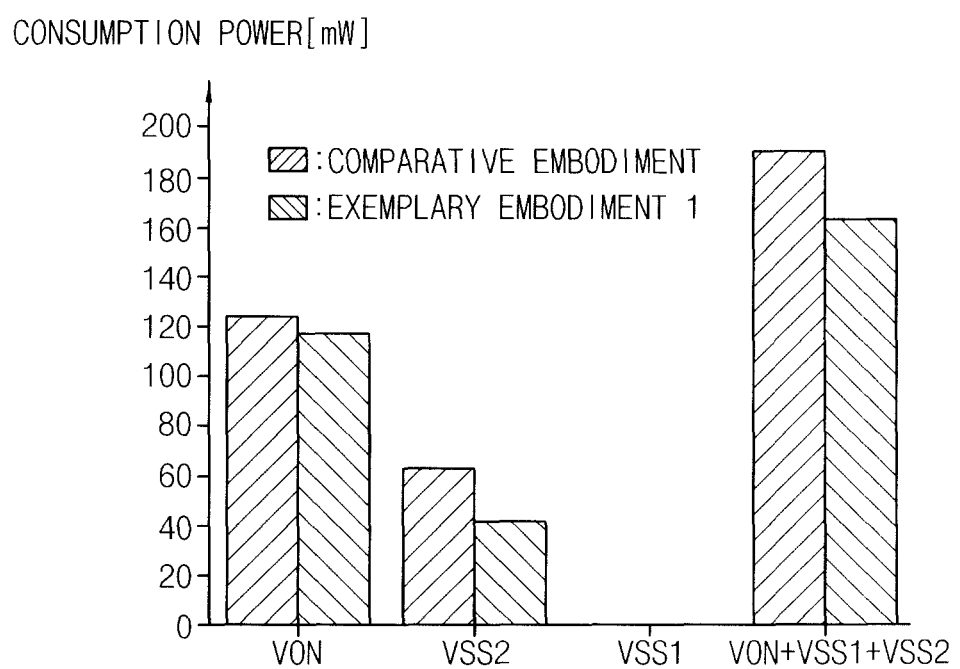
FIG. 17 is a graph showing a simulation result for comparing power consumption by a sample circuit in FIG. 2, and power consumption by a sample circuit according to a comparative embodiment.

FIG. 17 is a graph showing a simulation result for comparing power consumption by a sample circuit according to FIG. 1, and power consumption by a sample circuit according to a comparative embodiment.

The gate drive circuit 200 as shown in FIG. 4 was driven by using the high voltage VDD, the first voltage VSS1 and the second voltage VSS2 in accordance with the comparative embodiment. Due to the high voltage VDD, the first voltage VSS1 and the second voltage VSS2, the gate drive circuit 200 consumed power of about 123.77 milliwatts (mW), about 66.34 milliwatts (mW) and about 0.4 milliwatt (mW), respectively. That is, total power consumption of the gate drive circuit 200 of the comparative embodiment was about 190.51 mW.

In comparison, the gate drive circuit 200 was driven by using the high voltage VDD, the first voltage VSS1 and the second voltage VSS2 in accordance with FIGS. 2-6. Due to the high voltage VDD, the first voltage VSS1 and the second voltage VSS2, the gate drive circuit 200 consumed power of about 117 mW, about 46.09 mW and about 0.2 mW, respectively. That is, total power consumption of the gate drive circuit 200 of FIGS. 2-6 was about 163.29 mW.

Therefore, a power consumption of the gate drive circuit 200 due to an output of the sample circuit according to FIGS. 2-6 may be decreased by about 14% with respect to a power consumption of a gate drive circuit 200 due to an output of the sample circuit according to the comparative embodiment.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A voltage generating circuit comprising:
a first charge pumping part pumping a switching voltage, in response to a reference voltage received through a first reference terminal, and outputting a first voltage through a first output terminal; and
a second charge pumping part pumping the switching voltage, in response to the first voltage, and outputting a second voltage through a second output terminal, the second voltage being lower than the first voltage and being decreased in accordance with time due to an aging of the voltage generating circuit, and
wherein the second charge pumping part includes a first resistor connected between the first output terminal and a second reference terminal which is between the first output terminal and the second output terminal.

2. The voltage generating circuit of claim 1, wherein the second charge pumping part further comprises:
a first diode including a cathode connected to the second reference terminal;
a second diode including a cathode connected to an anode of the first diode, and an anode connected to the second output terminal of the second charge pumping part outputting the second voltage;
a first capacitor including a first terminal connected between the first and second diodes, and a second terminal connected to an input terminal of the second charge pumping part receiving the switching voltage; and
a second capacitor including a first terminal connected to the second output terminal of the second charge pumping part, and a second terminal connected to the first reference terminal receiving the reference voltage.

3. The voltage generating circuit of claim 2, wherein the second charge pumping part further comprises a third capacitor connected between a cathode of the first diode and the first reference terminal.

4. The voltage generating circuit of claim 3, wherein the second charge pumping part further comprises a second resistor connected to the first resistor in parallel between the first output terminal and the second reference terminal, and configured to have a resistance value which decreases as a temperature increases.

5. A voltage generating circuit comprising:
a first charge pumping part pumping a switching voltage, in response to a reference voltage received though a first reference terminal, and outputting a first voltage through a first output terminal; and
a second charge pumping part pumping the switching voltage, in response to the first voltage, and outputting a second voltage through a second output terminal, the second voltage being lower than the first voltage and being decreased in accordance with time due to an aging of the voltage generating circuit,
wherein the second charge pumping part comprises:
a first diode including a cathode connected to the first output terminal;
a second diode including a cathode connected to an anode of the first diode;
a first resistor including a first terminal connected to an anode of the second diode and a second terminal connected to the second output terminal;

a first capacitor including a first terminal connected between the first and second diodes, and a second terminal connected to an input terminal of the second charge pumping part receiving the switching voltage; and a second capacitor including a first terminal connected to the first terminal of the first resistor, and a second terminal connected to the first reference terminal receiving the reference voltage, wherein a first directional path is formed between the cathode of the first diode and the second terminal of the first resistor.

6. The voltage generating circuit of claim 5, wherein the second charge pumping part further comprises a third capacitor connected to the second terminal of the first resistor and the first reference terminal.

7. The voltage generating circuit of claim 6, wherein the second charge pumping part further comprises a third output terminal outputting a third voltage, in which the switching voltage is pumped in response to the first voltage.

8. The voltage generating circuit of claim 7, wherein the third voltage is a clock signal of a low level.

9. The voltage generating circuit of claim 6, wherein the second charge pumping part further comprises a second resistor connected to the first resistor in parallel between the anode of the second diode and the second output terminal, the second resistor configured to have a resistance value which decreases as a temperature increases.

10. A display apparatus comprising:
a display panel comprising:
a display area on which gate wiring, and source wiring crossing the gate wiring, are disposed and configured to display images; and
a peripheral area surrounding the display area;
a source drive circuit outputting a plurality of a data signal to the source wiring;
a voltage generating circuit comprising:
a first charge charging pumping part pumping a switching voltage, in response to a reference voltage received through a first reference terminal, and outputting a first voltage through a first output terminal; and
a second charge pumping part pumping the switching voltage, in response to the first voltage, and outputting a second voltage through a second output terminal, the second voltage being lower than the first voltage and being decreased in accordance with time due to an aging of the voltage generating circuit; and
a gate drive circuit disposed on the peripheral area, and generating a gate signal, the gate drive circuit providing the gate wiring with a gate signal of a high level at a first interval, and providing the gate wiring with a gate signal of a low level based on the first and second voltages at a second interval, and
wherein the second charge pumping part includes a first resistor connected between the first output terminal and a second reference terminal which is between the first output terminal and the second output terminal.

11. The display apparatus of claim 10, wherein the second charge pumping part further comprises:
a first diode including a cathode connected to the second reference terminal;
a second diode including a cathode connected to an anode of the first diode, and an anode connected to the second output terminal of the second charge pumping part outputting the second voltage;
a first capacitor including a first terminal connected between the first and second diodes, and a second terminal connected to an input terminal of the second charge pumping part receiving the switching voltage; and
a second capacitor including a first terminal connected to the second output terminal of the second charge pumping part, and a second terminal connected to the first reference terminal receiving the reference voltage.

12. The display apparatus of claim 11, wherein the second charge pumping part further comprises a second resistor connected to the first resistor in parallel between the first output terminal and the second reference terminal, wherein the second resistor has a resistance value which decreases as a temperature increases.

13. The display apparatus of claim 10, wherein the gate drive circuit comprises a plurality of stages, each stage comprising:
a pull-up part outputting a high voltage of a clock signal as a high voltage of a gate signal, in response to a high voltage of a first node;
a pull-down part pulling down the high voltage of the gate signal to the first voltage, in response to a high voltage of a carry signal of one of the stages corresponding to a following stage;
a first maintaining part maintaining the gate signal to the first voltage in response to the clock signal; and
a second maintaining part maintaining a voltage of the first node to the second voltage, in response to the clock signal.

14. The display apparatus of claim 13, wherein the each stage further comprises:
a carry part outputting the clock signal as a carry signal, in response to the voltage of the first node; and
a discharging part discharging the voltage of the first node to the second voltage, in response to the carry signal of the one of the stages corresponding to the following stage.

15. The display apparatus of claim 14, wherein the each stage further comprises:
a third maintaining part maintaining the voltage of the first node to the second voltage, in response to a carry signal of one of the stages corresponding to a previous stage;
a fourth maintaining part maintaining the voltage of the first node to the second voltage, in response to the carry signal of the one of the stages corresponding to the following stage; and
a fifth maintaining part maintaining an output voltage of the carry part to the second voltage, in response to the carry signal of the one of the stages corresponding to the following stage.

16. The display apparatus of claim 14, wherein the each stage further comprises:
a switching part discharging a voltage of a second node to the first voltage during the first interval in which the high voltage of the carry signal is outputted, and applying a signal synchronized with the clock signal to the second node during the remaining interval except the first interval.

17. The display apparatus of claim 14, wherein the each stage further comprises:
a buffer part applying a carry signal to the first node of one of the stages corresponding to a previous stage, in response to a carry signal of one of the stages corresponding to a previous stages; and
a charging part connected between the first node and an output part of the pull-up part.

* * * * *